US012596306B2

(12) United States Patent
Sheats et al.

(10) Patent No.: US 12,596,306 B2
(45) Date of Patent: Apr. 7, 2026

(54) PHOTOCHEMICAL AND THERMAL RELEASE LAYER PROCESSES AND USES IN DEVICE MANUFACTURING

(71) Applicant: Terecircuits Corporation, Mountain View, CA (US)

(72) Inventors: Jayna Sheats, Palo Alto, CA (US); Matthew Robinson, Orinda, CA (US)

(73) Assignee: TERECIRCUITS CORPORATION, Mountain View, CA (US)

( * ) Notice: Subject to any disclaimer, the term of this patent is extended or adjusted under 35 U.S.C. 154(b) by 613 days.

(21) Appl. No.: 18/054,098

(22) Filed: Nov. 9, 2022

(65) Prior Publication Data

US 2023/0144598 A1     May 11, 2023

Related U.S. Application Data

(60) Provisional application No. 63/278,323, filed on Nov. 11, 2021.

(51) Int. Cl.
| | |
|---|---|
| *G03F 7/20* | (2006.01) |
| *G03F 1/60* | (2012.01) |
| *G03F 1/68* | (2012.01) |
| *G03F 7/00* | (2006.01) |
| *G03F 7/09* | (2006.01) |

(52) U.S. Cl.
CPC .............. *G03F 7/2002* (2013.01); *G03F 1/60* (2013.01); *G03F 1/68* (2013.01); *G03F 7/0002* (2013.01); *G03F 7/091* (2013.01); *G03F 7/092* (2013.01); *H01L 2221/68368* (2013.01)

(58) Field of Classification Search
CPC ......... H01L 2221/68368; G03F 7/0002; G03F 7/161
See application file for complete search history.

(56) References Cited

U.S. PATENT DOCUMENTS

| | | | | |
|---|---|---|---|---|
| 5,256,506 | A | 10/1993 | Ellis et al. | |
| 6,946,178 | B2 | 9/2005 | Sheats et al. | |
| 8,865,489 | B2 * | 10/2014 | Rogers ................ | H01L 25/0753 438/459 |
| 8,877,298 | B2 * | 11/2014 | Yuen ........................ | G03F 7/161 427/512 |
| 11,804,397 | B2 * | 10/2023 | Marinov .............. | B23K 26/354 |
| 2005/0054121 | A1 * | 3/2005 | Handy ................ | H01L 21/6835 438/3 |
| 2008/0233489 | A1 | 9/2008 | Blanchet et al. | |

(Continued)

OTHER PUBLICATIONS

Capasso et al., "New frontiers in quantum cascade lasers and applications". IEEE J Selected Topics in Quantum Electronics. Nov. 2000;6(6): 931-947.

(Continued)

*Primary Examiner* — Amanda C. Walke
(74) *Attorney, Agent, or Firm* — Knobbe, Martens, Olson & Bear, LLP

(57) ABSTRACT

A process for transferring a component from a release layer by exposing the release layer to light and heat from different sources is described. The process includes providing an assembly comprising a substrate, a release layer and a component, heating the release layer and exposing the release layer to an actinic wavelength of light, wherein the heating source and the actinic irradiation source are different sources.

32 Claims, 9 Drawing Sheets

(56)                 References Cited

U.S. PATENT DOCUMENTS

| | | | | |
|---|---|---|---|---|
| 2011/0244390 | A1* | 10/2011 | Felder | B41M 5/46 |
| | | | | 430/200 |
| 2017/0358623 | A1* | 12/2017 | Thothadri | H05K 3/0026 |
| 2018/0358246 | A1* | 12/2018 | Kobrin | H01L 24/83 |
| 2019/0057891 | A1* | 2/2019 | Marinov | H01L 21/3065 |
| 2019/0393069 | A1* | 12/2019 | Paranjpe | B32B 7/12 |
| 2020/0023479 | A1* | 1/2020 | Lin | H01L 21/68 |
| 2022/0005863 | A1* | 1/2022 | Thothadri | H10H 20/856 |
| 2022/0216087 | A1* | 7/2022 | Van Den Brand | C09J 7/35 |
| 2022/0319829 | A1* | 10/2022 | Sheats | H01L 23/29 |
| 2022/0336251 | A1* | 10/2022 | Jain | H01L 21/6835 |
| 2023/0130004 | A1* | 4/2023 | Love | C08G 64/0208 |
| | | | | 156/230 |
| 2023/0333475 | A1* | 10/2023 | Sheats | G03F 7/0045 |

OTHER PUBLICATIONS

Chen et al., "Highly ultraviolet transparent textured indium tin oxide thin films and the application in light emitting diodes". Appl Phys Lett. Jun. 12, 2017;110(24): 242101.

Orita et al., "Deep-ultraviolet transparent conductive $\beta$-$Ga_2O_3$ thin films". Appl Phys Lett. Dec. 12, 2000; 77(25): 4166.

Parshin et al., "Domain structures in nematic liquid crystals on a polycarbonate surface". Int J. Mol Sci. Aug. 7, 2013; 14(18): 16303-16320.

Tamilavan et al., "Synthesis of new near infrared absorption polymers based on thiadiazoloquinoxaline and their solar cell applications". Synth Met. (2012) 162: 1184-1189.

Wei et al.,"High electrical conducting deep-ultraviolet-transparent oxide semiconductor La-doped SrSnO3 exceeding~ 3000 S cm—1". Appl Phys Lett. Jan. 13, 2020;116(2):022103 in 19 pages.

Yu et al., "Optical properties of wurtzite structure GaN on sapphire around fundamental absorptionedge (0.78-4.77 eV) by spectroscopic ellipsometry and the optical transmission method". Appl Phys Lett. Jun. 16, 1997;70(24): 3209-3211.

International Search Report and Written Opinion dated Feb. 28, 2023 for Application No. PCT/US2022/049432, filed Nov. 9, 2022; in 15 pages.

* cited by examiner

PHOTOCHEMICAL AND THERMAL RELEASE LAYER PROCESSES AND USES IN DEVICE MANUFACTURING

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57, and Rules 4.18 and 20.6, such as U.S. Provisional App. No. 63/278,323, filed Nov. 11, 2021.

BACKGROUND

Field

This invention relates to release layers used to releasably transfer components from one surface to another during manufacturing of microelectronic devices.

Description of the Related Art

The transfer of microelectronic objects from one surface to another pervades processes of assembly and packaging of functional products, whether they are purely electronic (as in computer motherboards), optoelectronic (as in displays, or optical communication devices on or between electronic components), sensors, or actuators. The physics of patterning systems limits the size of the system that can be made in one integrated parallel process, and process compatibility limits the type of materials. Thus useful systems require integration at the packaging level.

Integrated circuits, which allow various components (e.g. passive components) to be fabricated with the same techniques as transistors, allowed entire functional circuits to be made with parallel processing; that is, the simultaneous processing of an area, rather than a device. Today much of the innovation in microelectronics is centered on packaging, and specifically heterogeneous packaging. This means that many different types of integrated technologies (silicon ICs—digital or analog, compound semiconductor ICs and light emitters and receivers, microelectromechanical sensors, and other devices and systems) are put together in novel ways which achieve greater performance.

Although many techniques have recently been used for processing and packaging microelectronics, such as serial pick-and-place, laser ablation, stamps and adhesives, there remains a need for further advances in the art.

SUMMARY

For purposes of summarizing the disclosure and the advantages achieved over the prior art, certain objects and advantages of the disclosure are described herein. Not all such objects or advantages may be achieved in any particular embodiment. Thus, for example, those skilled in the art will recognize that the invention may be embodied or carried out in a manner that achieves or optimizes one advantage or group of advantages as taught herein without necessarily achieving other objects or advantages as may be taught or suggested herein.

All of these embodiments are intended to be within the scope of the invention herein disclosed. These and other embodiments will become readily apparent to those skilled in the art from the following detailed description of the preferred embodiments having reference to the attached figures, the invention not being limited to any particular preferred embodiment(s) disclosed.

In one aspect, a process for transferring a component is described. The process includes: providing an assembly comprising a substrate, a release layer and a component, wherein the release layer is disposed over the substrate and the component is adhered to the release layer; heating the release layer from a heating source to at least a decomposition temperature, wherein the heating is selected from the group consisting of a conductive heating, a radiative heating, and combinations thereof; and exposing the release layer to an actinic wavelength of light from an actinic irradiation source; wherein the heating and exposing steps degrade the release layer and transfer the component from the substrate to a target substrate; wherein the heating source and the actinic irradiation source are different sources; and wherein at least one of the heating and exposing steps are performed within a pulse period.

In some embodiments, the heating comprises radiative heating with a radiative wavelength of light, wherein the overlap between the radiative wavelength and actinic wavelength is at most 20%. In some embodiments, the radiative heating is at a radiative wavelength selected from the group consisting of a UV wavelength, a visible wavelength, an IR wavelength, a microwave wavelength, and combinations thereof. In some embodiments, the radiative heating is at a radiative wavelength of about 300 nm to about 100000 nm. In some embodiments, the substrate comprises a donor plate and a light absorbing material. In some embodiments, the light absorbing material is selected from the group consisting of $Nd_2O_3$, $Sm_2O_3$, $V_2O_3$, $CoO$, $NiO$, $MnO_2$, a polycarbonate compound, an aromatic compound, and combinations thereof. In some embodiments, the radiative heating is applied from a side edge of the assembly.

In some embodiments, the decomposition temperature is about 100° C. to about 350° C. In some embodiments, the process further comprises heating the release layer to a first temperature prior to heating the release layer to the decomposition temperature. In some embodiments, the first temperature is about 100° C. to about 350° C. In some embodiments, the pulse period is about 10 ns to about 10 μs. In some embodiments, the heating step is performed prior to the exposing step. In some embodiments, the heating step is performed subsequent to the exposing step. In some embodiments, the heating step is performed concurrently with the exposing step.

In some embodiments, the actinic wavelength of light is selected from the group consisting of a UV wavelength, a visible wavelength, and combinations thereof. In some embodiments, the actinic wavelength of light is about 200 nm to about 400 nm. In some embodiments, the actinic irradiation source comprises a power density of about 10 $mJ/cm^2$ to about 200 $mJ/cm^2$.

In some embodiments, the heating is applied directly to the release layer. In some embodiments, the heating is applied directly to the component, and the components heats the release layer to the decomposition temperature. In some embodiments, the heating is applied directly to the substrate, and the substrate heats the release layer to the decomposition temperature.

In some embodiments, the assembly further comprises a conductive heating source. In some embodiments, the conductive heating source comprises a transparent conductive heating source. In some embodiments, the transparent conductive heating source is selected from the group consisting of ITO, β-Ga$_2$O$_3$, gold, silver, La-doped SrSnO$_3$, and combinations thereof.

In another aspect, a process for transferring a component is described. The process includes: providing an assembly comprising a substrate, a release layer and a component, wherein the release layer is disposed over the substrate and the component is adhered to the release layer; heating the release layer from a heating source to at least a decomposition temperature, wherein the heating is selected from the group consisting of a conductive heating, a radiative heating and combinations thereof, and wherein the decomposition temperature is about 180° C. to about 220° C.; and exposing the release layer to an actinic wavelength of light from an actinic irradiation source, wherein the actinic wavelength of light is a wavelength of about 230 nm to about 360 nm; wherein the heating and exposing steps degrade the release layer and transfer the component from the substrate to a target substrate; wherein the heating source and the actinic irradiation source are different sources; and wherein at least one of the heating and exposing steps are performed within a pulse period of about 10 ns to about 10 μs.

In another aspect, an assembly for transferring a component is described. The assembly includes: a substrate; a plurality of heating sources disposed over the substrate; and a release layer disposed over the plurality of heating sources.

In some embodiments, the assembly further comprises a nanoporous material disposed between the substrate and the plurality of heating sources.

In another aspect, an assembly for transferring a component is described. The assembly includes: a substrate; a light absorbing layer disposed over the substrate; a first cladding layer disposed over the light absorbing layer; and a release layer disposed over the first cladding layer.

In some embodiments, the assembly further comprises a second cladding layer disposed between the substrate and the light absorbing layer. In some embodiments, the light absorbing layer is a graded light absorbing layer.

Figure 1:
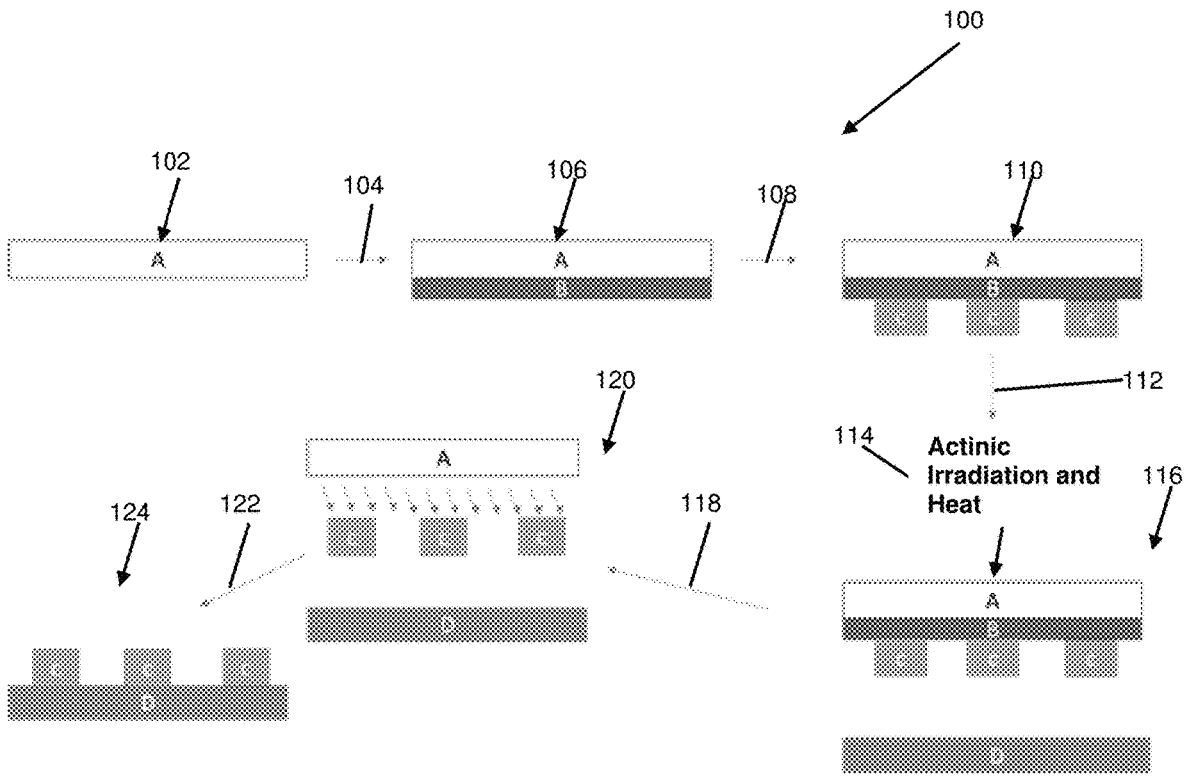
FIG. 1 illustrates an embodiment of a process flow in which a release layer composition (B) is used to transfer components (C) from an optically transparent donor plate (A) to a target substrate (D).

These and other embodiments are provided throughout the Application and in greater detail below.

DETAILED DESCRIPTION

Assemblies and methods of transferring components using releasable adhesion layers are discussed in U.S. Pat. No. 6,946,178 (the entire contents of which are incorporated herein by reference for all purposes). Triggering processes are used for separating the transfer components from the adhesion layer for placement on a substrate, and in U.S. Pat. No. 6,946,178 the triggering processes include exposing the release layer to heat and light in a single step to degrade the release layer.

In various embodiments of the present disclosure, a release layer is exposed to light and heat from different sources, steps and/or periods of times for the purpose of degrading the release layer. Degradation of the release layer may enable processes for transferring and/or transferring components (e.g., semiconductor components). The release layer composition may enable one to simultaneously place as many components on a surface as desired, limited only by how large one wants to make the mechanical fixture for the substrates. These components can range in size from microns (such as microLEDs) up to centimeters (such as large ICs).

The present disclosure describes embodiments that may 1) reduce the power and energy requirement of release layer processes; 2) reduce or eliminate the need for a laser (in some embodiments except for optional diodes), at least in the imaging system; 3) improve control of the kinetics of the reaction, including providing alternative and controllable distributions of temperature in space and time; and/or 4) provide a two-step mechanical implementation in which actinic exposure is separate from chip transfer, which may have capital and/or throughput advantages.

Definitions

A "release layer" is a layer comprising a polymeric and/or oligomeric material disposed over a substrate (e.g., donor plate) that enables the attachment (e.g., adhesion) of components (e.g., semiconductor components), and when exposed to light and heat degrades the release layer to release the components, which may enable the transferring of the components (e.g., chip transfer). The release layer may enable one to simultaneously place as many components on a substrate as desired, limited only by how large one wants to make the mechanical fixture for the substrates. These components can range in size from microns (such as microLEDs) up to centimeters (such as large ICs).

"Actinic irradiation" or "actinic light" is electromagnetic radiation that that causes photochemistry in the release layer that degrades or aids in degrading the release layer.

"Radiative heating" or "optical heating" is electromagnetic radiation that heats the release layer and degrades or aids in degrading the release layer.

"Conductive heating" is heat transfer from physical contact of a source (e.g., an electrical heating source) that heats the release layer and degrades or aids in degrading the release layer.

A "pulse period," "pulse length" or "$\tau$" is the time period during which a pulse of actinic irradiation, a pulse of radiating heating and/or a pulse of conductive heating causes the degradation reaction of the material in the release layer to proceed to substantial completion such that components disposed on the release layer are released and may be transferred. Gas molecules (e.g., $CO_2$ and/or $H_2O$) may be released from the release layer during the pulse period.

A "decomposition temperature" or "$T_{sd}$" is the temperature of the release layer necessary for the release material degradation reaction to proceed to substantial completion such that components disposed on the release layer are released and may be transferred. The decomposition temperature of the release layer may vary based on the composition of the material in the release layer.

General Description

The use of a release layer as described herein in a transfer process 100 is illustrated in FIG. 1. In the illustrated process flow, a donor plate (A) (e.g., an optically transparent donor plate) is provided 102 and coated 104 (e.g., solvent coated) with a film of a release layer material composition (B) to form a coated donor plate 106. Then the desired components (C) to be transferred are adhered 108 to the release layer (B) of the coated donor plate 106 by bringing the components (C) and release layer (B) into contact with applied pressure and/or heat to form a component loaded donor plate 110. In some embodiments, components are attached to a carrier substrate (e.g., tape) prior to being loaded onto the release layer. In some embodiments, uniform pressure may be applied to the carrier substrate and/or donor plate. In some embodiments, a pressure of, of about, of at most, or of at most about 500 N/cm$^2$, 1000 N/cm$^2$, 1500 N/cm$^2$, 2000 N/cm$^2$, 2250 N/cm$^2$, 2500 N/cm$^2$, 2750 N/cm$^2$, 3000 N/cm$^2$, 3250 N/cm$^2$, 3350 N/cm$^2$, 3750 N/cm$^2$ or 4000 N/cm$^2$, or any range of values therebetween is applied to the carrier substrate and/or donor plate. In some embodiments, pressure may be applied for, for about, for at least, or for at least about 1 minutes, 2 minutes, 3 minutes, 4 minutes, 5 minutes, 10 minutes, 15 minutes, 20 minutes, 30 minutes, 40 minutes, 50 minutes, 1 hours, 1.5 hours or 2 hours, or any range of values therebetween. In some embodiments, while the release layer and components are contacted for loading the release layer may be heated to a temperature of, of about, of at most, or of at most about, 40° C., 50° C., 60° C., 80° C., 100° C., 110° C., 120° C., 130° C., 140° C. or 150° C., or any range of values therebetween. In some embodiments, the release layer is allowed to cool to room temperature before the pressure is removed.

In some embodiments, once the components are attached to the release layer, the carrier substrate may be removed (e.g., peeled off) to afford the component loaded donor plate 110. The component loaded donor plate 110 is then aligned 112 with a target substrate (D) surface prior to actinic irradiation and exposure to heat (e.g., radiative heating and/or conductive heating) 114 of the release layer (B). In some embodiments, actinic irradiation and/or radiative heating of the release layer may be achieved through an optically transparent donor plate, and/or the release layer is directly exposed to the actinic irradiation and/or radiative heating. Actinic irradiation and heating induces a photochemical reaction in the release layer (B) that catalyzes the decomposition of the polymeric and/or oligomeric material into low molecular weight species that are then vaporized to form components (C) released from the donor plate (A) 120. As described herein, actinic irradiation and heating 114 are performed from different sources, and in some embodiments may be initiated at different, the same or similar times (e.g., different steps) and/or at different, the same or similar lengths of times (e.g., pulse length). The vaporization generates a force that pushes the components (C) to land 122 onto the target substrate (D), where they adhere to the surface to form a component loaded substrate 124.

The process illustrated in FIG. 1 depends on the release layer substantially degrading after exposure to actinic irradiation of a specific wavelength and energy (e.g., X-ray, UV, vis, IR), and after being heated to a decomposition temperature (e.g., about 200° C.), wherein at least one of the final steps of actinic irradiation or heating are performed within a pulse period. In some embodiments, the pulse length (i.e., $\tau$) is, is about, is at most, or is at most about, 10 ns, 25 ns, 50 ns, 75 ns, 80 ns, 90 ns, 100 ns, 125 ns, 150 ns, 175 ns, 200 ns, 250 ns, 300 ns, 350 ns, 400 ns, 450 ns, 500 ns, 600 ns, 700 ns, 800 ns, 900 ns, 1 μs, 1.2 μs, 1.5 μs, 2 μs, 3 μs, 4 μs, 5 μs, 6 μs, 7 μs, 8 μs, 9 μs, 10 μs or 12 μs, or any range of values therebetween. In some embodiments, the decomposition temperature (i.e., $T_{sd}$) of the release layer is, is about, is at least, or is at least about, 100° C., 125° C., 150° C., 160° C., 170° C., 180° C., 190° C., 200° C., 210° C., 220° C., 225° C., 230° C., 240° C., 250° C., 260° C., 270° C., 275° C., 280° C., 290° C., 300° C., 325° C. or 350° C., or any range of values therebetween. In some embodiments, the release layer is a continuous layer disposed over the donor plate. In some embodiments, the release layer may be a patterned release layer comprising a plurality of release layer elements, where each release layer element is separate from other release layer elements. In the absence of at least one of such light and heat, the release layer maintains chemical integrity and/or good adhesion.

Figure 2:
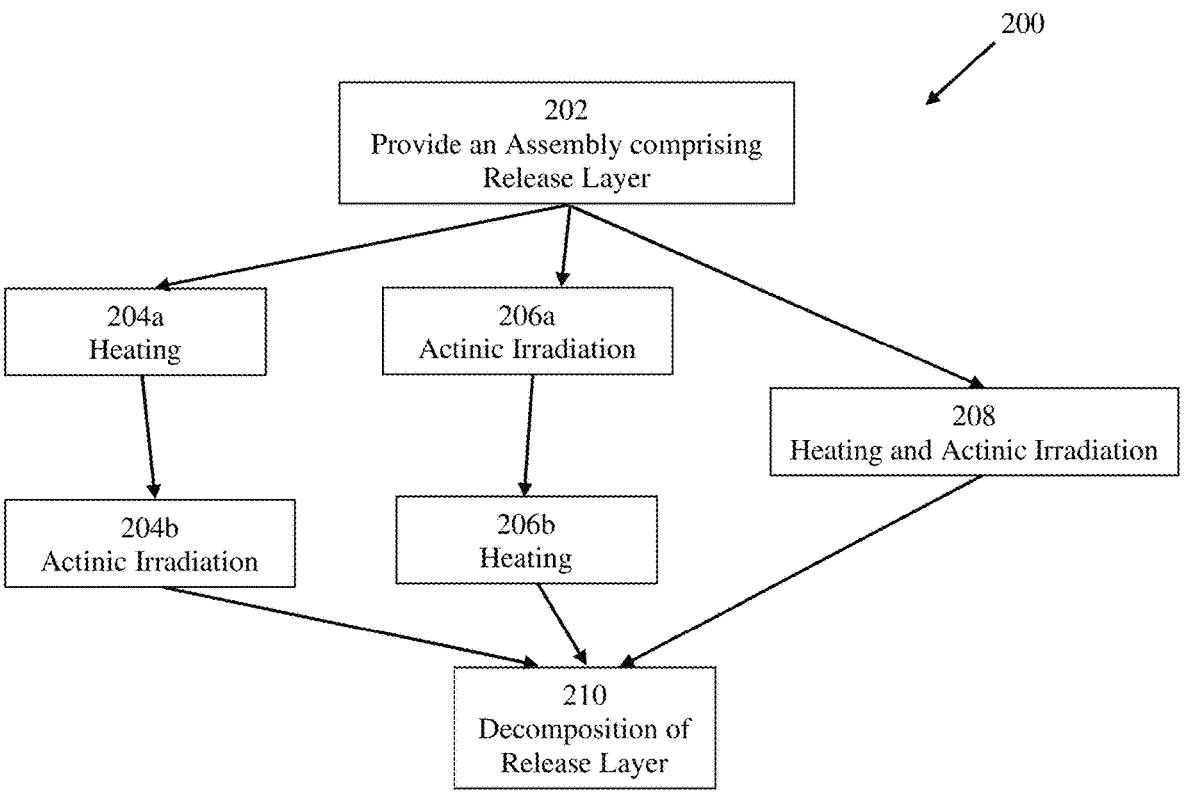
FIG. 2 is a flow chart illustrating embodiments of processes for heating and/or exposing an assembly to light to decompose a release layer.

FIG. 2 is a flow chart illustrating embodiments of processes 200 for heating (e.g., radiative heating and/or conductive heating) and exposing an assembly to actinic irradiation to decompose a release layer, such as actinic irradiation and heating step 114 depicted in FIG. 1. An assembly comprising a release layer is provided 202, and may be first heated 204a to or above a decomposition temperature then subsequently exposed to actinic irradiation 204b within a pulse period to cause the decomposition of the release layer 210. Alternatively, the assembly comprising a release layer 202 may be first exposed to actinic irradiation 206a then subsequently heated 206b to or above a decomposition temperature and within a pulse period to cause the decomposition of the release layer 210. In another embodiment, the assembly comprising a release layer 202 may be concurrently heated to or above a decomposition temperature and exposed to actinic irradiation 208 to cause the decomposition of the release layer 210, wherein at least one of the heating and actinic irradiation is performed within a pulse period.

Figure 3:
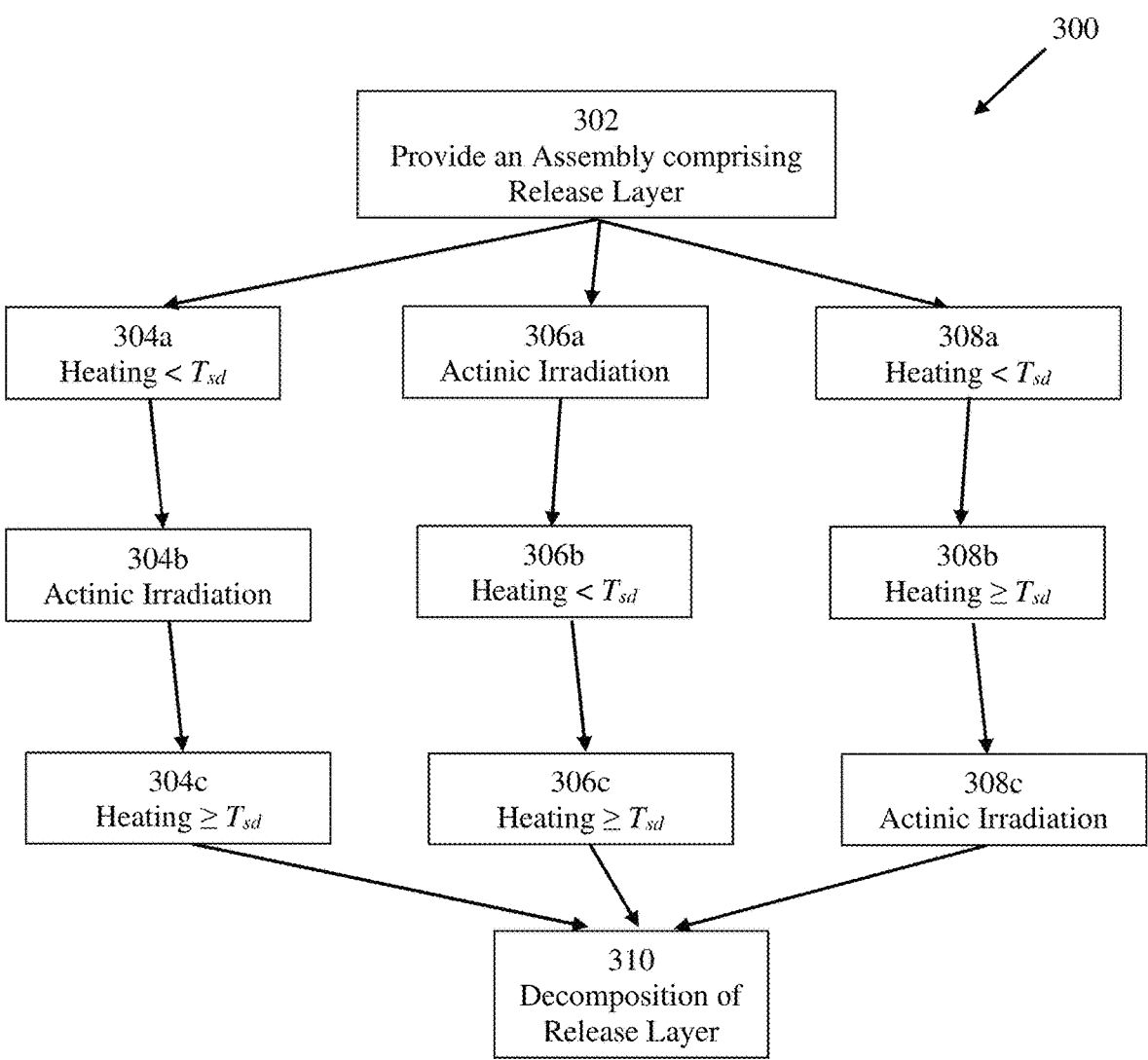
FIG. 3 is a flow chart illustrating embodiments of processes for heating and/or exposing an assembly to light to decompose a release layer, wherein multiple heating steps are performed.

FIG. 3 is a flow chart illustrating embodiments of processes 300 for heating (e.g., radiative heating and/or conductive heating) and exposing an assembly to actinic irradiation to decompose a release layer polymeric and/or oligomeric material, wherein a heating step below the material decomposition temperature and a heating step at or above the material decomposition temperature are performed. In some embodiments, the heating step below the decomposition temperature is performed by radiative heating and the heating step at or above the decomposition temperature is performed by conductive heating. In some embodiments, the heating step below the decomposition temperature is performed by conductive heating and the heating step at or above the decomposition temperature is performed by radiative heating. In some embodiments, the two heating steps are both radiative heating. In some embodiments, the two heating steps are both conductive heating. An assembly comprising a release layer is provided 302, and may be first heated 304a below a decomposition temperature, then subsequently exposed to actinic irradiation 304b, and then subsequently heated 304c at or above the decomposition temperature within a pulse period to cause the decomposition of the release layer 310. Alternatively, the assembly comprising a release layer 302 may be first exposed to actinic irradiation 306a, then subsequently heated 306b below a decomposition temperature, and then subsequently heated 306c at or above the decomposition temperature and within a pulse period to cause the decomposition of the release layer 310. In another embodiment, the assembly comprising a release layer 302 may be first heated 308a below a decomposition temperature, then subsequently heated 308b at or above the decomposition temperature, and then subsequently exposed to actinic irradiation 308c within a pulse period to cause the decomposition of the release layer 310. In some embodiments, actinic irradiation exposure may be combined with heating below the decomposition temperature or heating at or above the decomposition temperature (e.g., steps 304a and 304b combined, steps 304b and 304c combined, steps 306a and 306b combined, steps 308b and 308c combined).

In some embodiments, the assembly (e.g., donor plate and/or release layer) is heated to a first temperature, and subsequently heated to a second temperature. In some embodiments, the first temperature is at, at about, below, or below about, the material decomposition temperature. In some embodiments, the first temperature is at, at about, above, or above about, the material decomposition temperature. In some embodiments where the first temperature is, is about, is above, or is about above, the material decomposition temperature, the assembly is allowed to cool below the material decomposition temperature before being heated to a second temperature. In some embodiments, the second temperature is at, at about, above, or above about, the material decomposition temperature. In some embodiments, the first temperature is, is about, is at most, or is at most about, 40° C., 50° C., 60° C., 70° C., 80° C., 90° C., 100° C., 125° C., 150° C., 160° C., 170° C., 180° C., 190° C., 200° C., 210° C., 220° C., 225° C., 230° C., 240° C., 250° C., 260° C., 270° C., 275° C., 280° C., 290° C., 300° C., 325° C. or 350° C., or any range of values therebetween. In some embodiments, the second temperature is, is about, is at least, or is at least about, 100° C., 125° C., 150° C., 160° C., 170° C., 180° C., 190° C., 200° C., 210° C., 220° C., 225° C., 230° C., 240° C., 250° C., 260° C., 270° C., 275° C., 280° C., 290° C., 300° C., 325° C. or 350° C., or any range of values therebetween.

In some embodiments, actinic irradiation and heating of the release layer may be initiated at different, the same or similar times (e.g., different steps) and/or at different, the same or similar lengths of times (e.g., pulse length). In some embodiments actinic irradiation may be initiated prior to, concurrently with and/or subsequent to heating. In some embodiments, the length of time the release layer is exposed to actinic irradiation may completely overlap, partially overlap or do not overlap (e.g., actinic irradiation and heating steps are performed consecutively or are performed with a delay between the performance of the steps) with a length of time heating is performed. For example, in some embodiments the heat necessary to achieve a decomposition temperature is provided to the release layer during a pulse period, and the actinic irradiation may be supplied to the release layer on any timescale (e.g., prior to, subsequent to, and/or during the heating). In another example, in some embodiments the release layer may be heated to the required temperature continuously, and actinic irradiation may be supplied to the release layer during a pulse period (e.g., prior to, subsequent to, and/or during the heating). It is to be understood that in some embodiments, any intermediate combination of the previously discussed two examples may be possible. For example, in some embodiments the release layer may be heated to some value below $T_{sd}$ (e.g., about 180° C.) over a time period longer than r, and then further heating the release layer to $T_{sd}$ (e.g., about 200° C.) within a time r, wherein the actinic irradiation may be supplied to the release layer on any timescale (e.g., prior to, subsequent to, and/or during at least one of the heating steps).

Decomposing the release layer (e.g., patterned release layer) comprises exposing the release layer to actinic irradiation and heat from different sources. In some embodiments, at least one of actinic irradiation and heating may be performed by exposing the release layer to light. In some embodiments, the release layer is exposed to light from the release layer facing side of the assembly, or through the donor plate facing side of the assembly. In embodiments, where light is directed to the release layer facing side of the assembly, the donor plate may be opaque or at least partially transparent. In embodiments, where light is directed through the donor plate the donor plate is at least partially transparent to at least the wavelength range of light exposed. In some embodiments, wherein the donor plate is opaque or non-transparent, radiative heating light is directed to the donor plate, wherein the heated donor plate conductively heats the release layer.

In some embodiments, the release layer (e.g., patterned release layer) is configured to control the release velocity and/or trajectory of the component when the release layer is decomposed and the component is released. In some embodiments, the released at least one component has a release velocity of, of about, of at most, or of at most about, 0.1 m/s, 0.3 m/s, 0.5 m/s, 0.8 m/s, 1 m/s, 2 m/s, 3 m/s, 4 m/s, 5 m/s, 6 m/s, 8 m/s or 10 m/s, or any range of values therebetween. In some embodiments, the release layer is configured to chip-flip at least one component when the at least one release layer element is decomposed and the at least one component is released. Release velocity and/or trajectory can be controlled in various ways similar to control over rotation, e.g., by asymmetrical positioning of the component and/or using a shaped charge release layer element(s).

In some embodiments, the release layer (e.g., patterned release layer) comprises a void and/or escape channel. In some embodiments, when the release layer is decomposed the gas product is configured to flow through the escape channel. In some embodiments, when the release layer is decomposed the void and/or escape channel is configured to control, or aid in controlling, the velocity and/or trajectory of the released component. In some embodiments, when the release layer is decomposed the escape channel is configured to control, or aid in controlling, the orientation and/or rotation of the component (e.g. chip-flip).

In some embodiments, heating generates the heat on one side of the release layer, away from the release plane. In some embodiments, the pulse spreads out over 0.5 μm in ~1

µs. As such, the temperature will be non-uniform during some fraction of the reaction (after 10 µs the diffusion length is still only 1.4 µm). In some embodiments, a thinner film of the release layer may achieve greater heat uniformity. In some embodiments, a thin film of the conductive heating source alone may cause the release layer adjacent to this layer to have a higher temperature than the release layer adjacent to the components or the release layer farther away from the conductive heating source. In some embodiments, the release layer film may have a gradient of a sensitizer (e.g., photoacid generator ("PAG")) that sensitizes the polymer and/or oligomer to aid in degradation, with a lower concentration in the upper part and higher in a lower part that is cast after the first. Because the degradation reaction rate is dependent on catalyst concentration as well as temperature, in some embodiments the gradient may aid in uniformly releasing components from the release layer. In some embodiments, a heating source is disposed over an additional polymer layer that has lower thermal conductivity than the polymer and/or oligomer material in the release layer. In some embodiments, the additional polymer comprises a nanoporous polymer with a low density. In some embodiments, the release layer is thinner (e.g., of the order of <1 µm or even a few hundred nm). In some embodiments, the additional polymer layer aids in creating a uniform temperature of the release layer when heated.

In some embodiments, the entire apparatus containing the substrate (e.g., donor plate), release layer and components, including fixtures which hold those elements, may be heated to a stable temperature near $T_{sd}$, and then the photochemistry is initiated by a rapid optical pulse of radiative heating and/or actinic irradiation.

In some embodiments, the process disclosed advantageously allows for the use of a photobleachable mask (e.g. based on substituted anthracenes). In some embodiments, photobleachable masks absorb strongly in the near-UV (~360-380 nm) and much more strongly around 260 nm, but do not absorb at or around 300 nm. In some embodiments, irradiation (e.g. laser and/or diode irradiation) may be performed at wavelengths shorter than 300 nm (e.g. about 266 or 248 nm). Additionally, in some embodiments the processes disclosed herein may allow the potential to use other photoactive sensitizers (e.g., PAGs) without worrying about the specific laser or diode frequencies. In some embodiments, photoactive sensitizers (e.g., PAGs) that work in the near UV may be utilized, such that the anthracene chemistry could be used directly. In some embodiments, sensitization may also be utilized.

Release Layer, Compositions and Compounds

The composition of the release layer includes an oligomer and/or polymer composition. The oligomer and/or polymer composition may include an oligomeric and/or polymeric component that comprises a unit containing a tetralin or cyclohexene core and a linkage connecting the core to other cores and/or parts of the composition.

In some embodiments, the release layer composition comprises a polymer material. In some embodiments, the release layer composition comprises a polymeric component that is intermixed with the oligomeric component. In some embodiments, the polymeric component forms a homogenous film with the oligomeric component. In some embodiments, the polymer component comprises a plurality of polymers. In some embodiments, polymeric component can be used in amounts effective to modulate material properties and/or the release properties of the release layer film. In some embodiments, polymeric components include a linear homopolymer, block copolymer, polymeric network, etc. In some embodiments, the polymeric component acts as a matrix to support the oligomeric component, dictates the release layer's physical properties and/or optical properties. Tailoring the material properties of the release layer by modifying the polymeric component may be advantageous as the properties of the release layer can be altered on a per application basis without having to redesign the oligomeric ingredient. Furthermore, different polymers can alter the processing conditions for adhering the components to the release layer. In addition, network polymers may aid to trap non-volatile residue from being transferred during gas evolution. In some embodiments, the polymeric component is photochemically inert. In some embodiments, the polymeric component is photochemically active. Examples of potential polymeric components include: a polymeric component containing a tetralin or cyclohexene core and a linkage, polypropylene, poly(propyl carbonate), polyurethane, ABS block copolymer, polyesters, polyvinyl chloride, polystyrene, copolymers thereof, and combinations thereof. An example of a network polymer could be a polyethylene glycol polymer crosslinked by thiolene photochemistry after deposition onto the donor substrate.

In embodiments of the release layer compositions described herein, the decomposing material (e.g. the oligomeric component) is a majority ingredient (i.e. the ingredient that makes up the largest wt % or mass %) of the release layer formulation. In embodiments of the release layer compositions described herein, the decomposing material (e.g. the oligomeric component) is a minority ingredient of the release layer formulation. For example, in an embodiment, a polymeric component can be the main ingredient of the release layer, while the oligomeric component is a minority ingredient. In some embodiments, the release layer composition comprises, comprises about, comprises at least, comprises at least about, comprises at most, or comprises at most about, 1 wt. %, 5 wt. %, 10 wt. %, 15 wt. %, 20 wt. %, 25 wt. %, 30 wt. %, 35 wt. %, 40 wt. %, 45 wt. %, 50 wt. %, 55 wt. %, 60 wt. %, 65 wt. %, 70 wt. %, 75 wt. %, 80 wt. %, 85 wt. %, 90 wt. %, 95 wt. % or 98 wt. % of the oligomeric component, or any range of values therebetween. In some embodiments, the release layer composition comprises, comprises about, comprises at least, comprises at least about, comprises at most, or comprises at most about, 1 wt. %, 5 wt. %, 10 wt. %, 15 wt. %, 20 wt. %, 25 wt. %, 30 wt. %, 35 wt. %, 40 wt. %, 45 wt. %, 50 wt. %, 55 wt. %, 60 wt. %, 65 wt. %, 70 wt. %, 75 wt. %, 80 wt. %, 85 wt. %, 90 wt. %, 95 wt. % or 98 wt. % of the polymeric component, or any range of values therebetween.

When the chemical bonds in the linkages of the oligomer and/or polymer are cleaved through the application of heat and actinic irradiation, the residue of the linkage is converted into a relatively volatile, unreactive small molecule. The gaseous byproducts generate a force through volume expansion that pushes the adhered component onto a target substrate. As described herein, the linkages of the oligomer and/or polymer compounds may be cleaved by application of heat (radiative heat and/or conductive heat) and actinic irradiation. In some embodiments, the oligomer and/or polymer compounds may be heated directly and/or indirectly through the heating of another layer disposed on or near the release layer (e.g., the substrate) and/or heating of an element within the release layer composition. For example, in some embodiments the tetralin core is an aromatic chromophore that may facilitate film heating by radiative heating (e.g., by a laser) with a wavelength approximately in the range of 240-300 nm. The cyclohexene core may be indirectly heated through radiative heating of a compound within the film that acts as a chromophore with a wavelength absorbed by the chromophore.

In some embodiments the decomposed cores may be converted into unreactive and volatile products. For example, for carbonate linkages attached to benzylic positions of tetralin (i.e. tetrahydronaphthalene), when the carbonates are cleaved the tetrahydronaphthalene core will be converted into naphthalene, which is unreactive and volatile. This also drives the decomposition reaction to completion due to formation of an aromatic system. As another example, benzylic carbonates (e.g. oligomeric or polymeric components with a tetralin (i.e. tetrahydronaphthalene) unit and a carbonate linkage) may be advantageous as the benzylic functionality stabilizes the cationic intermediate of carbonate cleavage and may result in a much faster and lower energy cleavage reaction. As a further example, bis-carbonate core (i.e. oligomeric or polymeric components with a tetralin (i.e. tetrahydronaphthalene) or cyclohexene linked to two carbonate linkages) may be advantageous as cleaving two carbonates results in the formation of two C=C bonds thereby resulting in a fully aromatic structure. The formation of the aromatic structure may aid in driving the rapid linkage cleavage and gas formation.

In some embodiments, the release layer composition comprises a photoactive sensitizer. In some embodiments, a photoactive sensitizer may be a thermal sensitizing agent, a photoacid generator ("PAG"), and combinations thereof. In various embodiments, the release layer composition comprises a thermal sensitizing agent, in the form of one or more additives that absorb radiative heating light and convert it into heat. Thermal sensitizing agents may have a high photon absorption quantum yield, a low fluorescence/phosphorescence quantum yield, and/or a short excited state lifetimes that decay through non-irradiative pathways. They may be used in amounts effective to aid the heating rate during radiative heating and thereby increase the rate of linkage decomposition and gas formation. These agents can also facilitate heating with lower power and longer wavelength lasers. In some embodiments, the thermal sensitizing agent will form a homogenous film with the release layer formulation. In some embodiments, the thermal sensitizing agent will form a transparent film with the release layer formulation. In some embodiments, the thermal sensitizing agent will form an opaque film with the release layer formulation. Examples of thermal sensitizing agents in some embodiments include, inorganic agents, gold plasmonic nanoparticles, silver plasmonic nanoparticles, gold nanowires, silver nanowires, carbon based agents, carbon nanotubes, carbon black, graphene, graphene oxide, organic based agents, and metallic agents. In some embodiments, organic based thermal sensitizing agents include one or more of the following structural properties: aromaticity, fused multicyclic systems, S or N containing heterocycles, multicyclic systems, and/or multi-aromatic systems. Examples of organic based thermal sensitizing agents include melanin, eumelanin, indole, pyrrole, quinoline, purine, triphenyl methyl compounds (e.g. (methoxymethanetriyl)tribenzene), fused aromatic compounds (e.g. anthracene and pyrene), dibenzothiophene, thiophene, and derivatives thereof.

In various embodiments, the release layer composition comprises a photoacid generator (PAG). In some embodiments, the PAG includes a chromophore unit and an acid precursor unit. In some embodiments, the chromophore unit is selected from diphenyliodonium, triphenylsulfonium, and combinations thereof. In some embodiments, the acid precursor unit is selected from trifluoromethanesulfonate (i.e., triflate), hexafluorophosphate, nitrate, p-toluenesulfonate, perfluoro-1-butanesulfonate, and combinations thereof. In some embodiments, the PAG is an ionic PAG or a non-ionic PAG. In some embodiments, the ionic PAG is selected from diphenyliodonium nitrate, bis(4-tert-butylphenyl) iodonium perfluoro-1-butanesulfonate, bis(4-tert-butylphenyl)iodonium p-toluenesulfonate, (4-phenylthiophenyl)diphenylsulfonium triflate, triarylsulfonium hexafluorophosphate, and combinations thereof. In some embodiments, the non-ionic PAG is selected from N-hydroxynaphthalimide triflate, N-hydroxy-5-norbornene-2,3-dicarboximide perfluoro-1-butanesulfonate, 2-(4-methoxystyryl)-4,6,-bis(trichloromethyl)-1,3,5-tirazine, and combinations thereof. In some embodiments, the PAG is (4-Phenylthiophenyl)diphenylsulfonium trifluoromethanesulfonate.

In another embodiment, additives that absorb radiative heating light and convert it into heat can be the main ingredient of the release layer. They may be used in amounts effective to aid the heating rate during radiative heating and thereby increase the rate of oligomeric and/or polymeric decomposition and gas formation. These agents can also facilitate heating with lower power and longer wavelength lasers. Examples of additives include colloidal metals, Si, $SiO_2$, $TiO_2$, $SnO_2$, anthracene, naphthalene, dimethoxybenzene, tetrahydronaphthalene, diphenyl ether, phenylcyclohexane, tert-butylphenol, acetoxy-tetrahydronaphthalene, and derivatives thereof. In some embodiments, the additives are configured to absorb at wavelengths of, of about, of at most, of at most about, of at least, or of at least about, 300 nm, 320 nm, 350 nm, 400 nm, 450 nm, 500 nm, 550 nm, 600 nm, 650 nm, 700 nm, 750 nm, 800 nm, 850 nm, 900 nm, 950 nm, 1000 nm, 1100 nm, 1300 nm or 1500 nm, or any range of values therebetween.

Actinic Irradiation

Actinic irradiation of the release layer is used to cause photochemistry in the release layer that degrades or aids in degrading the release layer. In some embodiments, the wavelength of actinic irradiation (i.e., release wavelength) used to decompose or aid in the decomposition of a release layer is UV light, visible light, or combinations thereof. In some embodiments, the wavelength of actinic irradiation (i.e., release wavelength) used to decompose or aid in the decomposition of a release layer is, or is about, 180 nm, 200 nm, 210 nm, 220 nm, 230 nm, 240 nm, 250 nm, 260 nm, 270 nm, 280 nm, 290 nm, 300 nm, 310 nm, 320 nm, 330 nm, 340 nm, 350 nm, 360 nm, 370 nm, 380 nm, 390 nm, 400 nm or 450 nm, or any range of values therebetween. In some embodiments, sources of actinic irradiation include LEDs, lasers (e.g., diode lasers. solid state lasers, gas lasers, liquid lasers and fiber lasers), and combinations thereof. In some embodiments, the actinic irradiation may be provided in pulsed and/or continuous wave configurations. In some embodiments, the pulsed actinic irradiation has a pulse width of, of about, of at most, or of at most about, 0.3 ns, 0.5 ns, 0.7 ns, 0.8 ns, 0.9 ns, 1 ns, 3 ns, 5 ns, 8 ns, 10 ns, 25 ns, 50 ns, 75 ns, 80 ns, 90 ns, 100 ns, 125 ns, 150 ns, 175 ns, 200 ns, 250 ns, 300 ns, 350 ns, 400 ns, 450 ns, 500 ns, 600 ns, 700 ns, 800 ns, 900 ns, 1 μs, 1.2 μs, 1.5 μs, 2 μs, 3 μs, 4 μs, 5 μs, 6 μs, 7 μs, 8 μs, 9 μs, 10 μs or 12 μs, or any range of values therebetween. In some embodiments, the pulse width of the pulsed actinic irradiation is, is about, is at most, or is at most about the pulse period. In some embodiments, the actinic irradiation is performed in, in about, in at most, or in at most about, a pulse period. In some embodiments, the energy density of the actinic irradiation is, is about, is at least, or is at least about, 4 mJ/cm², 5 mJ/cm², 6 mJ/cm², 8 mJ/cm², 10 mJ/cm², 20 mJ/cm², 30 mJ/cm², 40 mJ/cm², 45 mJ/cm$^2$, 50 mJ/cm$^2$, 60 mJ/cm$^2$, 70 mJ/cm$^2$, 75 mJ/cm$^2$, 80 mJ/cm$^2$, 90 mJ/cm$^2$, 100 mJ/cm$^2$, 125 mJ/cm$^2$, 150 mJ/cm$^2$, 175 mJ/cm$^2$ or 200 mJ/cm$^2$, or any range of values therebetween.

Although the primary purpose of the actinic irradiation is to cause photochemistry in the release layer, some of the actinic irradiation may nevertheless be absorbed by compounds in the release layer composition and converted into heat. Such heat conversion of the actinic irradiation may be minimized by the selection of the wavelength and power density of the actinic irradiation and/or selection of the compounds of the release layer composition (e.g., polymers and photoactive sensitizers). In some embodiments, a polymer of the release layer composition absorbs the actinic irradiation in an amount of, of about, of at least, or of at least about, 30%, 40%, 50%, 60%, 70%, 80%, 90% or 95%, or any range of values therebetween. In some embodiments, a photoactive sensitizer of the release layer composition absorbs the actinic irradiation in an amount of, of about, of at most, or of at most about, 1%, 2%, 5%, 10%, 15%, 20%, 25%, 30%, 40% or 50%, or any range of values therebetween. In some embodiments, mostly by the polymer of the release layer composition absorbs the actinic irradiation, and may not be or is minimally absorbed by the photoactive sensitizer.

As an example, an incident Q-switched Nd:YAG laser pulse may be utilized, and may have a power density of ~50 mJ/cm$^2$ at a pulse width of 0-10 μs (e.g., 0-10 ns) that is effective in causing the reaction that degrades or aids in degrading the release layer. In some embodiments, other lasers, laser wavelengths of light, laser pulsing frequencies, and laser powers (more or less than ~50 mJ/cm$^2$) may also be utilized. In some embodiments, of the 50 mJ/cm$^2$ in an incident laser pulse at 266 nm, only about 30-70% is absorbed (depending on film thickness). In some embodiments, a fraction of the absorbed actinic irradiation (e.g., light) becomes heat, and a fraction becomes luminescence, in a yield unknown but possibly about 20%. This suggests that ~20 mJ/cm$^2$ of heat go into the polymer from the 10 ns pulse. Some of this may be lost to thermal diffusion. Using the simple formula of $r^2=2Dt$, the penetration distance through polycarbonate of a heat pulse is 0.5 μm in 1 μs, and 1.4 μm in 10 μs. The diffusion length in fused silica is 1.3 μm in 1 μs. With no diffusion, 15 mJ/cm$^2$ deposited instantaneously into polycarbonate would heat it by ~115K. If the required energy is 15 mJ/cm$^2$, the total energy for a 20 cm×20 cm donor plate (400 cm$^2$) is 6 J. The peak power, if delivered in 10 μs, would be 600 kW (1.5 kW/cm$^2$). The actual amount needed in practice may be greater due to the diffusion loss, but may be smaller if it is applied in a temporally optimized manner. These numbers set a "plausible target" for the laser pulse, but are not intended to prescribe a definite requirement.

Conductive Heating

The release layer may be heated through conductive heating (e.g., an electrical heating source) to degrade or aid in degrading the release layer. In some embodiments, conductive heating is applied directly to the release layer. In some embodiments, conductive heating is applied to the substrate (e.g., donor plate), which in turn conductively heats the release layer.

In some embodiments, a specific amount of heating energy is delivered to the release layer. In some embodiments, the conductive heating (e.g., electrical heating) is performed for a short period of time (e.g., microseconds), with a rapid onset (e.g., <1 μs). In some embodiments, the conductive heating is performed in, in about, in at most, or in at most about, a pulse period. In some embodiments, a slow actinic irradiation (e.g., beyond a pulse period) may be performed on the release layer before, after, or concurrently with heating to cause or aid in degradation (e.g., sensitization) of the release layer. In some embodiments, the conductive heating (e.g., electrical heating) is performed within a pulse period to cause or aid in causing the release layer to degrade and form a pulse of gas to release (e.g., push) the component from the substrate (e.g., donor plate). In some embodiments, conductive heating performed within a pulse period causes the gas to escape quickly and exert a force on the components, and/or avoids having the gas escape slowly and without exerting a force on the components. In some embodiments, the release of the components (e.g., transfer reaction) may not significantly be affected by how quickly the heat is turned off once the release layer degradation is complete. In some embodiments, the rate at which the heat is turned off may be considered for substrate (e.g., donor plate) heating. In some embodiments, the heat is directly applied into a thin film of a release layer (e.g., 1 μm thick), and a relatively small amount of the substrate (e.g., of the order of 1 mm or more thickness) may be heated. In some embodiments, the duty cycle of a heating source may be small (e.g. on for ~10$^{-5}$ s, off for ~1-10 s).

In some embodiments, the conductive heating source is an electrical heating source. In some embodiments, the electrical heating source comprises a conductive and resistive material (e.g., a thin film of material), wherein a current may be passed through the material on the desired time scale to heat that material. In some embodiments, the conductive heating source is disposed over (e.g., disposed on) at least one surface of the substrate (e.g., donor plate) comprising the release layer. In some embodiments, a conductive heating source is disposed over at least one of a top major surface (i.e., the same surface the release layer is disposed over), a bottom major surface (i.e., the opposite surface the release layer is disposed over) or a side surface. In some embodiments, the conductive heating source (e.g., conductor) is in electrical communication with a power supply. In some embodiments, the conductive heating source is in electrical communication with the power supply with electrodes that wrap around one or more edges of the substrate (e.g., donor plate). In some embodiments, the electrode leads may be covered (e.g., for protection and/or lower contact resistance) with another metal (e.g., gold, platinum, copper, nickel). In some embodiments, the power supply is in electrical communication (e.g., make contact) using brushes (e.g., as used in electric motors), or physical contact with a metal (e.g., a noble metal). In some embodiments, the conductive heating source is transparent or partially transparent (i.e., transparent conductive heating source) to a wavelength of interest (e.g., an actinic irradiation wavelength (e.g., a deep UV wavelength) and/or an optical heating wavelength). In some embodiments, the wavelength of interest is, or is about, 180 nm, 200 nm, 210 nm, 220 nm, 230 nm, 240 nm, 250 nm, 260 nm, 270 nm, 280 nm, 290 nm, 300 nm, 310 nm, 320 nm, 330 nm, 340 nm, 350 nm, 360 nm, 370 nm, 380 nm, 390 nm, 400 nm or 450 nm, or any range of values therebetween. In some embodiments, the transparent conductive heating source exhibits a transmittance to a wavelength of interest of, of about, of at least, or of at least about 8%, 10%, 15%, 20%, 25%, 30%, 35%, 40%, 45%, 50%, 60%, 70%, 80%, 90% or 95%, or any range of values therebetween. In some embodiments, the sheet resistance ("R$_s$") of the conductive heating source is, is about, is at most, or is at most about, 5Ω/□, 10Ω/□, 15Ω/□, 20Ω/□, 25Ω/□, 30 Ω/□, 35Ω/□, 45Ω/□, 45Ω/□, 50Ω/□, 55Ω/□, 60Ω/□, 70Ω/□, 80Ω/□, 90Ω/□, $100\Omega/\square$, $150\ \Omega/\square$, $200\Omega/\square$, $250\Omega/\square$, $300\Omega/\square$, $400\Omega/\square$, $500\Omega/\square$, $600\Omega/\square$, $700\Omega/\square$, $800\Omega/\square$, $900\Omega/\square$, $1000\Omega/\square$, $1200\Omega/\square$ or $1500\Omega/\square$, or any range of values therebetween. In some embodiments, the conductive heating source has a thickness of, of about, of at most, or of at most about, 3 nm, 4 nm, 5 nm, 10 nm, 15 nm, 20 nm, 25 nm, 30 nm, 35 nm, 40 nm, 45 nm, 50 nm, 55 nm, 60 nm, 65 nm, 70 nm, 80 nm, 85 nm, 90 nm, 100 nm, 110 nm, 120 nm, 130 nm, 150 nm, 175 nm, 200 nm, 250 nm, 300 nm, 400 nm, 500 nm or 1000 nm, or any range of values therebetween. In some embodiments, the transparent conductive heating source comprises a transparent conducting oxide ("TCO"). In some embodiments, TCOs include indium tin oxide ("ITO") (e.g., textured ITO), $\beta$-$Ga_2O_3$, gold (Au), silver (Ag), and La-doped $SrSnO_3$. In some embodiments, TCOs include indium tin oxide ("ITO") (e.g., textured ITO), $\beta$-$Ga_2O_3$, gold (Au) and La-doped $SrSnO_3$.

Figure 4A:
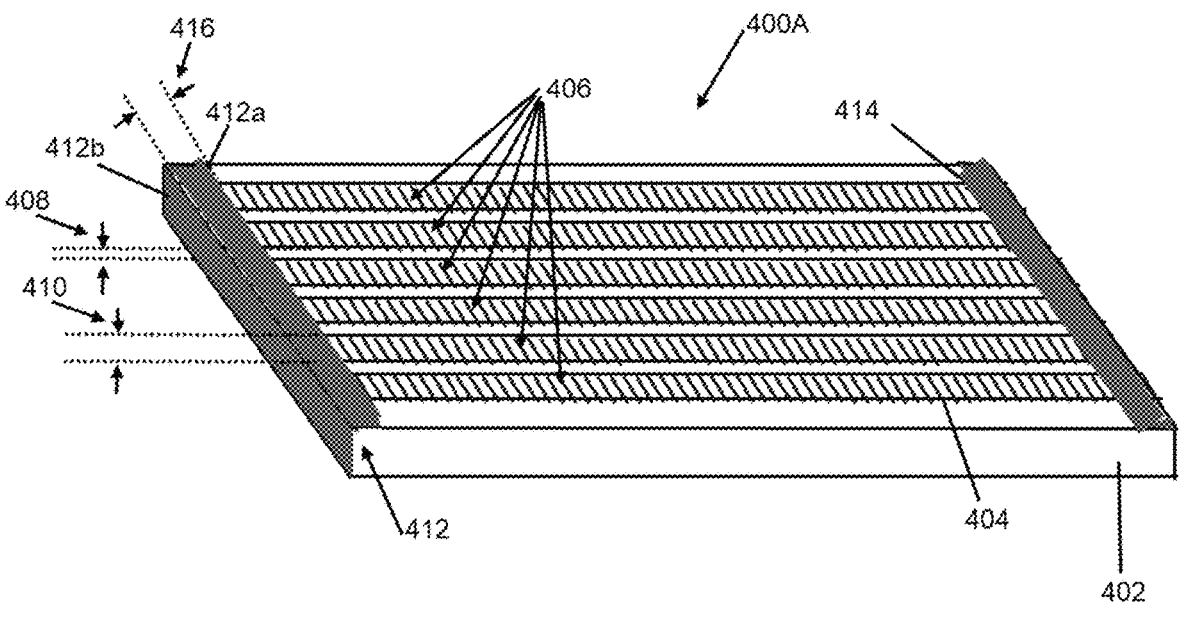
FIG. 4A illustrates a plane view of an embodiment of a donor plate assembly comprising a plurality of heating sources.
Figure 4B:
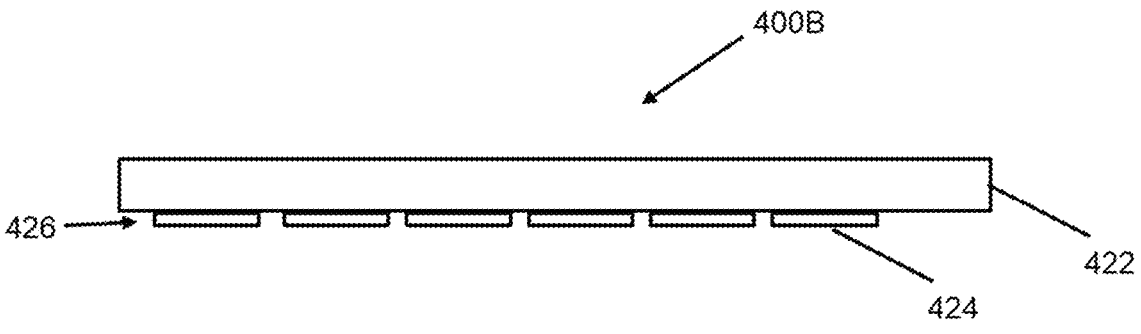
FIG. 4B illustrates a side view of an embodiment of a donor plate assembly comprising a plurality of heating sources.
Figure 4C:
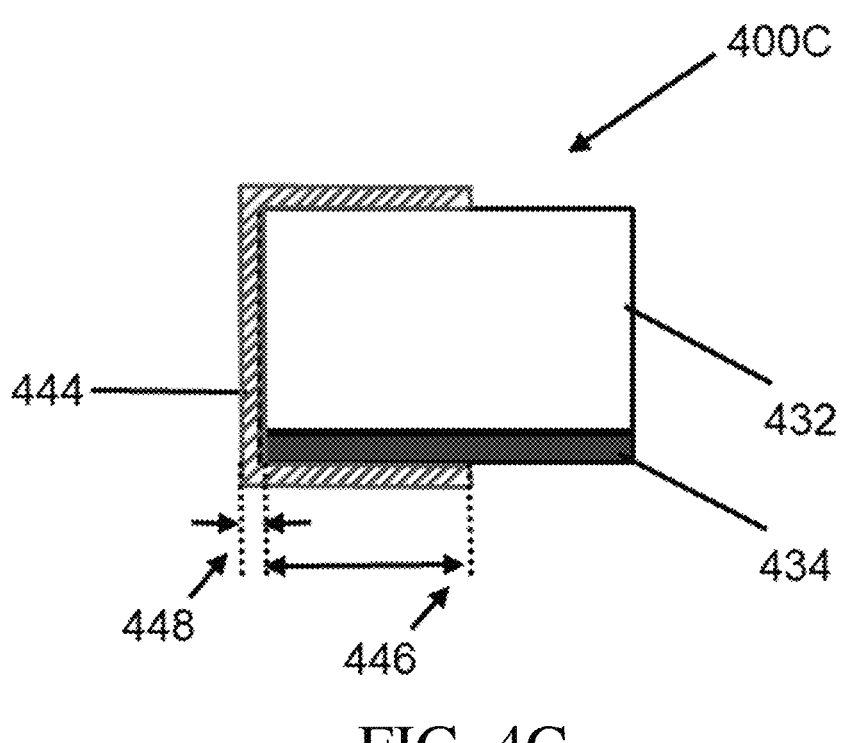
FIG. 4C illustrates a cross sectional view of an embodiment of a donor plate assembly comprising a plurality of heating sources.
Figure 4D:
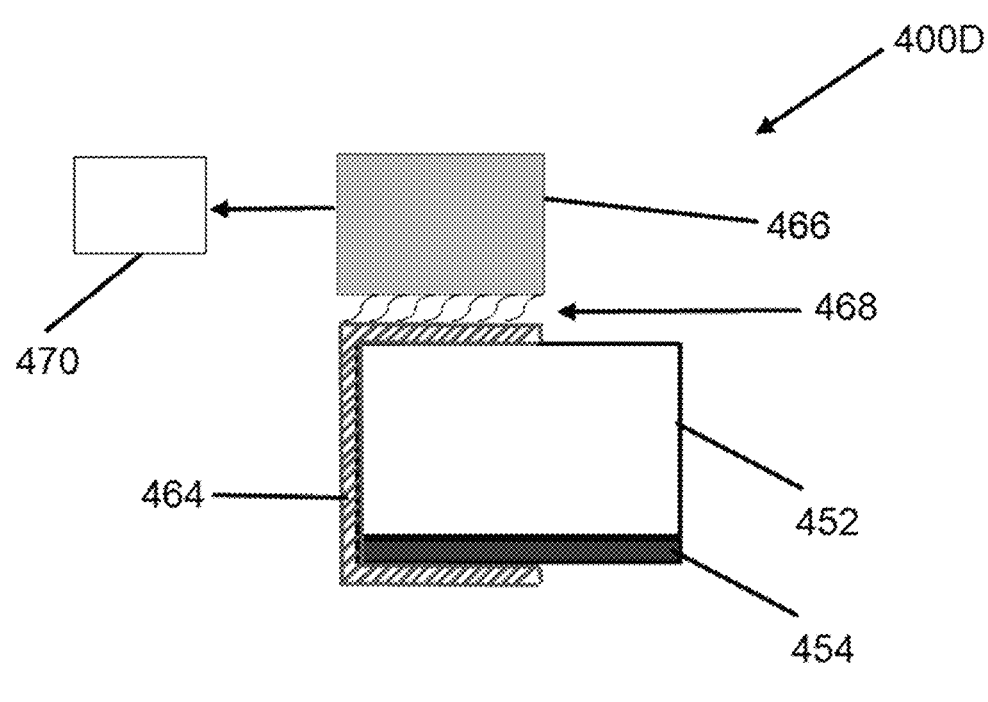
FIG. 4D illustrates a cross sectional view of an embodiment of a donor plate assembly comprising a plurality of heating sources in electrical contact with a power supply.

FIGS. 4A-4D illustrate embodiments of a donor plate assembly comprising a plurality of heating sources. FIG. 4A shows assembly 400A which includes a donor plate 402 and at least one heating source strip 404, wherein a plurality of the heating source strips 406 are disposed over the donor plate 402. The plurality of the heating source strips 406 are shown separated from each other by a strip distance 408, and each heating source strip 404 is shown with a width 410. At a distal end of the donor plate 402 and the plurality of heating source strips 406 a distal busbar 412 is disposed over the donor plate 402 and the plurality of heating source strips 406, and at a proximal end of the donor plate 402 and the plurality of heating source strips 406 a proximal busbar 414 is disposed over the donor plate 402 and the plurality of heating source strips 406. The distal busbar 412 is depicted with a top busbar portion 412a disposed over the distal end of the top major surface of the donor plate 402, and a side busbar portion 412b disposed over the distal side edge of the donor plate 402. The width 416 of the top busbar portion 412a is also depicted. FIG. 4B shows a side view of an assembly 400B which includes a donor plate 422 and at least one heating source 424, wherein a plurality heating sources 426 are shown disposed over the donor plate 422. FIG. 4C shows a cross sectional view of an assembly 400C which includes a donor plate 432, a heating source 434 disposed over the donor plate 432, and a busbar 444 disposed over the heating source 434 and the top major surface, side edge surface and bottom major surface of the donor plate 432. The width 446 of the busbar 444 disposed over the top major surface of the donor plate 432, and the thickness 448 of the busbar 444 disposed over the side edge surface of the donor plate 432 are also depicted. FIG. 4D shows a cross sectional view of an assembly 400D which includes a donor plate 452, a heating source 454 disposed over the donor plate 452, and a busbar 464 disposed over the heating source 454 and the top major surface, side edge surface and bottom major surface of the donor plate 452, and a device 466 in electrical contact 468 (e.g., by the use of springs and/or brushes) with the busbar 464. The device is shown in electrical communication with a power supply 470.

In some embodiments, a busbar comprises a metal, for example such as Au and/or Pt. In some embodiments, the busbar is deposited over the donor plate and heating source, for example such as by plating and/or vacuum deposition. In some embodiments, the donor plate is, is about, is at most, or is at most about, 0.5 mm, 1 mm, 2 mm, 3 mm, 4 mm, 5 mm, 6 mm, 8 mm or 10 mm thick, or any range of values therebetween. In some embodiments, the heating source (e.g., TCO) is, is about, is at most, or is at most about 10 nm, 15 nm, 20 nm, 25 nm, 30 nm, 40 nm, 50 nm, 60 nm, 70 nm, 80 nm, 90 nm or 100 nm thick, or any range of values therebetween. In some embodiments, the distance between adjacent heating sources is, is about, is at least, or is at least about, 50 nm, 75 nm, 100 nm, 125 nm, 150 nm, 200 nm, 250 nm, 300 nm, 350 nm, 400 nm, 450 nm, 500 nm, 550 nm, 600 nm or 700 nm, or any range of values therebetween. In some embodiments, the width of the heating source strip is, is about, is at least, or is at least about, 250 nm, 300 nm, 350 nm, 400 nm, 450 nm, 500 nm, 550 nm, 600 nm, 700 nm, 800 nm, 900 nm, 1 μm, 1.5 μm, 2 μm, 3 μm, 4 μm, 5 μm, 10 μm, 50 μm, 100 μm, 500 μm, 1 mm or 5 mm, or any range of values therebetween. In some embodiments, the width of the busbar disposed over the top major surface of the donor plate is, is about, is at most, or is at most about, 0.5 mm, 1 mm, 2 mm, 3 mm, 4 mm, 5 mm, 6 mm or 8 mm, or any range of values therebetween. In some embodiments, the thickness of the busbar disposed over the side edge surface of the donor plate is, is about, is at most, or is at most about, 0.5 μm, 1 μm, 2 μm, 3 μm, 4 μm, 5 μm, 6 μm or 8 μm, or any range of values therebetween.

Figure 5A:
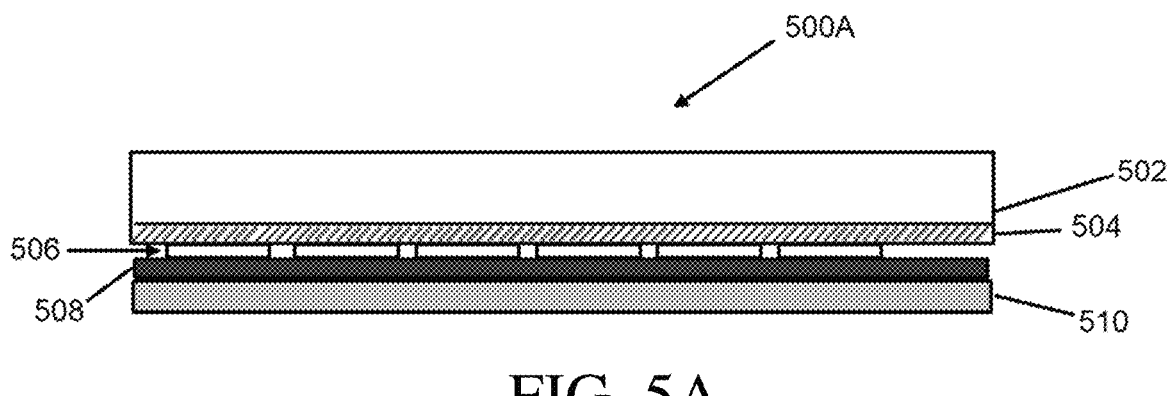
FIG. 5A illustrates a side view of an embodiment of a donor plate assembly comprising a nanoporous material layer.
Figure 5B:
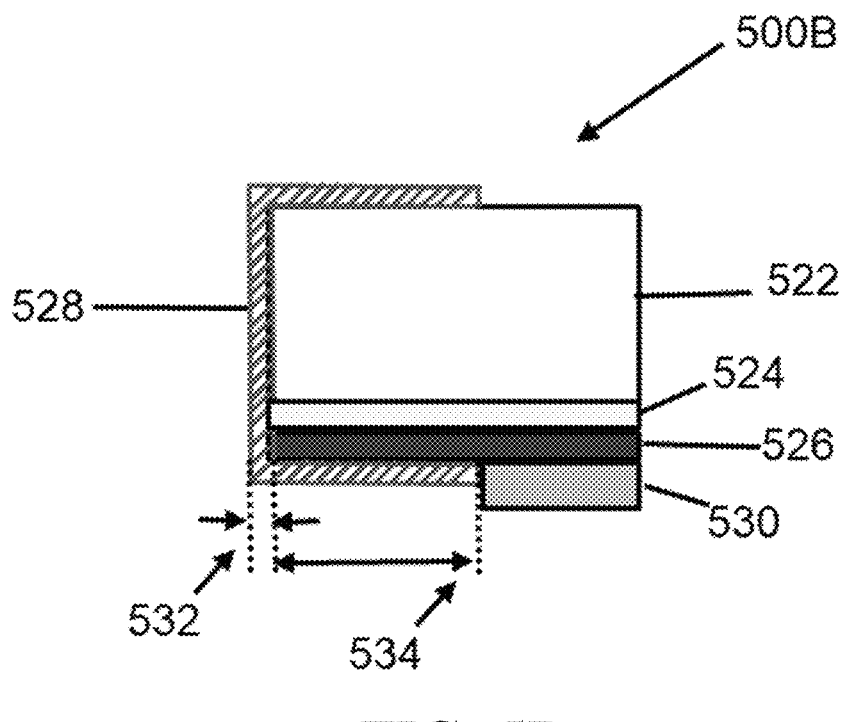
FIG. 5B illustrates a cross sectional view of an embodiment of a donor plate assembly comprising a nanoporous material layer.

FIGS. 5A and 5B illustrate embodiments of a donor plate assembly comprising a nanoporous material layer. FIG. 5A shows a side view of an assembly 500A which includes a donor plate 502, a nanoporous material layer 504 disposed over the donor plate 502, a plurality of heating sources 506 disposed over the donor plate 502 and the nanoporous material layer 504, a busbar 508 disposed over the plurality of heating sources 506, and a release layer 510 disposed over the busbar 508. FIG. 5B shows a cross sectional view of an assembly 500B which includes a donor plate 522, a nanoporous material layer 524 disposed over the donor plate 522, a heating source 526 disposed over the nanoporous material layer 524, a busbar 528 disposed over the heating source 526, and a release layer 530 adjacent to the busbar 508 and disposed over the heating source 526. The busbar 528 is shown disposed over a top major surface, side edge surface and bottom edge surface of the donor plate 522. The width 534 of the busbar 528 disposed over the top major surface of the donor plate 522, and the thickness 532 of the busbar 528 disposed over the side edge surface of the donor plate 522 are also depicted.

The requirements of the conductive heating (e.g., electrical requirements) may depend on how the heating is implemented. There are three ranges to consider: static, real-time, and a mixture.

Radiative Heating

The release layer may be heated through radiative heating (e.g., an IR heating source) to degrade or aid in degrading the release layer. For example, in some embodiment a specific amount of heating energy is delivered through optical heating current with, followed by or preceded by a second optical exposure of actinic radiation to cause photochemistry and degrade the release layer.

The spectrum of electromagnetic radiation can be divided for this purpose into UV, IR, visible and microwave regions. The UV spectrum can be further divided into near-UV (e.g., about 300-400 nm), mid-UV (e.g., about 200-300), and far-UV (e.g., about 100-200). The IR spectrum can be further divided into near-IR (e.g., about 800-2000 nm), mid-IR (e.g., about 2-10 μm), and far-IR (e.g., about 10 μm-1 mm). In some embodiments, radiative heating may be performed in the UV (e.g., near-UV, mid-UV and/or far-UV), IR (e.g., near-IR, mid-IR and/or far-IR), visible and microwave regions, or any combination of regions thereof. In some embodiments, radiative heating may be performed in the mid-IR region. In some embodiments, radiative heating is performed using a wavelength of, of about, of at least, or of at least about, 280 nm, 300 nm, 310 nm, 320 nm, 330 nm, 340 nm, 350 nm, 360 nm, 370 nm, 380 nm, 390 nm, 400 nm, 425 nm, 450 nm, 475 nm, 500 nm, 525 nm, 550 nm, 600 nm, 650 nm, 700 nm, 750 nm, 800 nm, 850 nm, 900 nm, 1000 nm, 1100 nm, 1200 nm, 1500 nm, 2000 nm, 2500 nm, 3000 nm, 3500 nm, 4000 nm, 5000 nm, 6000 nm, 7000 nm, 8000 nm, 9000 nm, 10000 nm, 12000 nm, 15000 nm, 20000 nm, 30000 nm, 50000 nm, 75000 nm or 100000 nm, or any range of values therebetween. In some embodiments, radiative heating may be performed in the IR region (e.g., mid-IR region). In some embodiments, microwaves may be utilized for radiative heating, and may be absorbed relatively strongly at some wavelengths.

In some embodiments, at least some of the radiative heating is absorbed by the substrate material (e.g. silicon, silica and $BaF_2$). For example, silicon begins to absorb significantly at wavelengths greater than 5 μm. Light of 10.6 μm is absorbed within a few microns at the surface of fused silica. Therefore, in some embodiments, radiative heating light of 10.6 μm may be applied to a fused silica substrate in a continuous wave (cw) mode to heat the substrate. In some embodiments, the substrate comprises multiple substrate materials and/or layers. For example, in some embodiments a fused silica layer can be deposited on a $BaF_2$ donor plate base layer and used as a heat generating thin film (e.g., with $CO_2$ laser radiation). In some embodiments, such a fused silica layer over $BaF_2$ configuration may utilize radiative heating in the pulsed mode of operation, since the heat does not have to diffuse through the entire substrate as may be necessary does for a fused silica donor plate base layer. As an example, in some embodiments for a pulsed system ~20 mJ/cm² is calculated to produce a temperature jump of 200° C. at the surface of the film, which decreases through the film thickness. This heat, if injected in a very rapid (e.g. 5 ns) time, is rapidly lost by diffusion. As such, in some embodiments either a longer irradiation period or multiple injections may be utilized. Note that 20 mJ/cm² on a 20×20 cm donor plate stretched over 1 ns is 8 MW. An another example, in some embodiments for a purely cw system, the DP essentially functions as a hotplate, such that the power dissipation rate is similar to what occurs when raising the surface temperature of a laboratory hotplate to 200° C., which is roughly 1 kW (for 20×20 cm).

In some embodiments, at least some of the radiative heating is absorbed by the release layer. In some embodiments, a radiative heating wavelength is selected to be absorbed and heat a polymer of the release layer composition. In some embodiments, an absorption of the polymer in the UV (e.g., near-UV, mid-UV and/or far-UV) is selected for the radiative heating. In some embodiments, the polymer has a strong absorption in the near-UV and a weaker absorption at the mid-UV (e.g., —300 nm) and/or far-UV. In some embodiments, the monomer of a polymer of the release layer (e.g. a carbonate monomer) has a near-UV and/or mid-UV absorbance (e.g., —300 nm).

In some embodiments, a radiative heating wavelength (e.g., UV) is absorbed by a component (e.g., Si component, GaN components, SiC components, AlP components, and/or GaAlInP components) disposed over the release layer. For example, silicon (Si) absorbs strongly ($\alpha$~$10^5$ cm$^{-1}$ or more) at about 375 nm, and GaN absorbs at about 355 nm. In some embodiments, gallium nitride quantum wells have at least some near-IR absorption around 6-7 μm. In some embodiments, a laser diode (LD) (e.g., a high power LD) may be used for radiative heating (e.g., at about 375 nm). In some embodiments, arrays may be constructed with high enough resolution to address individual components (e.g., chiplets).

Although typical commercially available laser diodes have large heat removal structures that may make them unsuitable for the heating of components, in some embodiments LDs may be used with low duty cycles (e.g., on for ~10 μs and then off for 1-10 s) in order to avoid the need of heat removal structures. GaN is transparent above and to about 360 nm, although different reports show slightly different cut-on frequencies that may be due to purity. In some embodiments, a diode-pumped YAG laser at 355 nm may be utilized (e.g, to optically heat GaN). In some embodiments, a diode-pumped YAG laser may advantageously have simpler optics (e.g., no imaging required). For example, in some embodiments, a 355 nm YAG or 351 nm XeF excimer may be utilized to produce strong absorption near the surface of a GaN component (e.g., an LED component) or a Si component, where Si absorbs ~10× more strongly at 355 nm than GaN.

In some embodiments, the wavelength for radiative heating is selected to avoid causing or aiding in causing photochemistry. In some embodiments, the wavelength for radiative heating does not or does not substantially overlap with the wavelength for actinic irradiation. Overlap of the wavelengths for radiative heating and actinic irradiation may be the integrated area under the spectral emission curve of the less intense source relative to the more intense source in the spectral region where they overlap, wherein the spectral emission curves are calibrated as energy per unit area per unit time. In some embodiments, the overlap between radiative heating wavelengths and the wavelength for actinic irradiation is, is about, is at most, or is at most about, 25%, 20%, 15%, 10%, 8%, 5%, 4%, 3%, 2%, 1%, 0.5%, 0.1% or 0%, or any range of values therebetween. In some embodiments, the overlap between the radiative heating full width at half max (FWHM) wavelengths and the actinic irradiation FWHM wavelengths is, is about, is at most, or is at most about, 25%, 20%, 15%, 10%, 8%, 5%, 4%, 3%, 2%, 1%, 0.5%, 0.1% or 0%, or any range of values therebetween. In some embodiments, the wavelength for radiative heating is selected to avoid absorption by a photoactive sensitizer of the release layer composition. In some embodiments, the photoactive sensitizer is a photoacid generator ("PAG") catalyst (e.g., —300 nm). For example, in some embodiments a PAG absorbs in the near UV, and therefore a far-UV radiative heating (e.g., from a high-power LED source) is used to heat the polymer of the release layer. In some embodiments, the radiative heating wavelength is longer and/or shorter than the photoactive sensitizer (e.g., PAG) absorption wavelength. In some embodiments, the PAG has its maximum absorption at about 300 nm. As discussed herein, there are LEDs which could serve as the actinic irradiation source, making the optical system simpler.

In some embodiments, the radiation which is used to heat the substrate, release layer (e.g., patterned release layer) and/or components may be injected parallel (i.e., from a side surface) to the element (e.g., film) rather than perpendicular to it (i.e., from a top or bottom major surface). In these embodiments, a waveguide structure is fabricated on the donor plate surface adjacent to the polymer film. In some embodiments, light, for example IR light, may be coupled into this waveguide structure on one edge of the donor plate, from which it travels across to the other side. In some embodiments, an absorption coefficient of 0.05/cm$^{-1}$ may be sufficient for approximately 60% of the light to be absorbed in 20 cm (a typical size for a donor plate in a production application). In some embodiments, this absorption may be slightly nonlinear, with 5.0% being absorbed in 1 cm distance at the entrance edge, and 2.0% in the final cm at the exit edge. However, in some embodiments light may be injected from a plurality of edges (e.g., both edges), with the result being a nearly uniform absorption throughout the plate (e.g. between 6.8% and 6.1%). In some embodiments, the uniformity can be improved by reducing the absorption coefficient below 0.05 cm$^{-1}$. In another embodiment, the absorption coefficient can be increased steadily across the donor plate during the fabrication process. resulting in a spatially uniform absorptivity profile.

Figure 6:
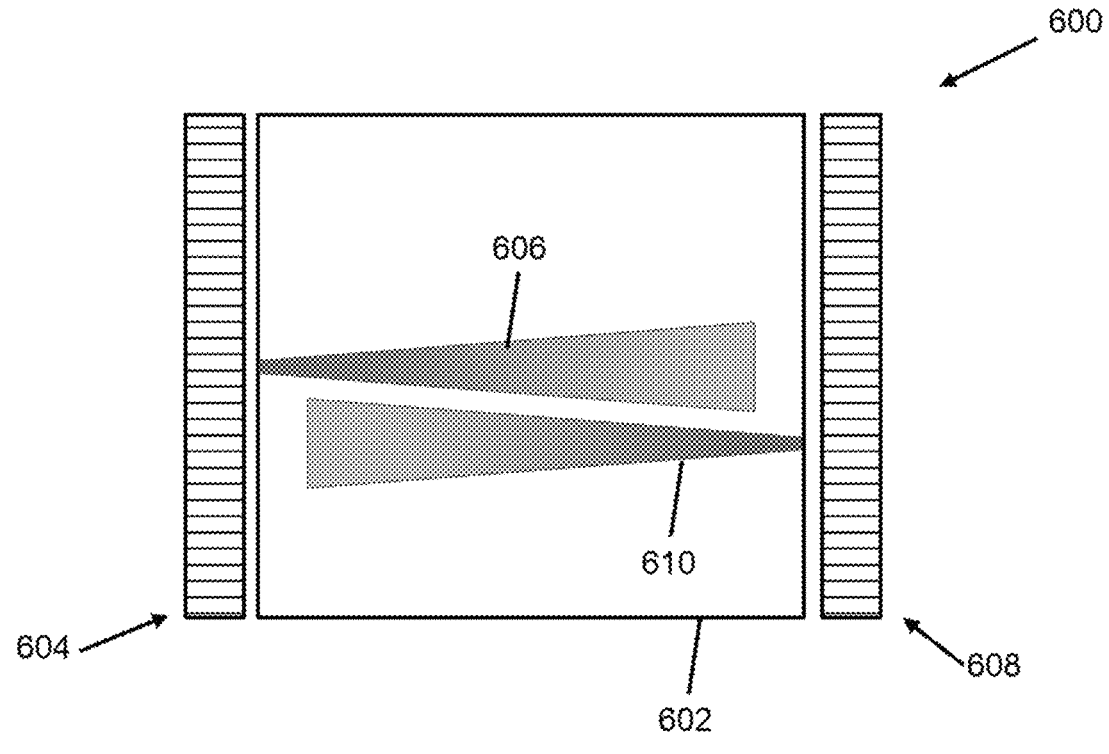
FIG. 6 illustrates a top view of an embodiment of a donor plate assembly heated by injection of light from the side of the substrate by an array of radiative heating sources.

FIG. 6 shows the top view of a system 600 including a donor plate assembly 602 with a proximal radiative heating source 604 and a distal radiative heating source 608 positioned at the side edges of the donor plate assembly 602. Proximal radiative heating source 604 is shown injecting proximal radiative heat 606 (e.g., IR light), and distal radiative heating source 608 is shown injecting distal radiative heat 610 into the respective side of the donor plate assembly 602. In some embodiments, the radiative heating source(s) includes an array of heating sources (e.g., an array of optical fibers, LEDs and/or lasers). In some embodiments the radiative heating sources comprise lenses (e.g., cylindrical lenses) to collimate, focus or diverge the light injected into the donor plate assembly. In some embodiments, the radiative heating sources inject light into and/or onto the substrate (e.g., donor plate and/or light absorbing material), the components and/or the release layer. In some embodiments, the injected radiative heating beam from the proximal and distal radiative heating sources form a substantially flat profile. In some embodiments, the injected radiative heating beam from the proximal and distal radiative heating sources are configured to be absorbed quasi-linearly.

In some embodiments, the substrate (e.g., donor plate) comprises a light absorbing material. In some embodiments, the light absorbing material is incorporated onto and/or within the substrate later. In some embodiments, a light absorbing layer is disposed over the substrate and comprises a light absorbing material and a host material. In some embodiments, the light absorbing material (e.g., near-IR absorbing material) may be deposited over or incorporated within a layer (e.g., glass). In some embodiments, the light absorbing material is deposited by vacuum deposition. In some embodiments, vacuum deposition includes evaporation, sputtering, ion-beam-assisted deposition, and combinations thereof. In some embodiments, the light absorbing material may have a significant absorbance in the UV (e.g., at the wavelength used for actinic irradiation). In some embodiments, the light absorbing material may have a UV absorbance greater than an IR absorbance. In some embodiments, a light absorbing material with a UV absorbance greater than an IR absorbance may not significantly hinder the application of actinic irradiation to the release layer because the thickness is of the order of 1-10 μm, less than $10^{-4}$ of the width of the substrate (e.g., donor plate). In some embodiments, materials suitable for the cladding of the IR waveguides, which are well known in the art of optical fibers, for example, have similar absorption properties with respect to UV light and may not interfere with the application. In some embodiments, depending on the index of refraction of the IR absorbing layer, the fused silica donor plate may serve as one cladding layer.

Figure 7:
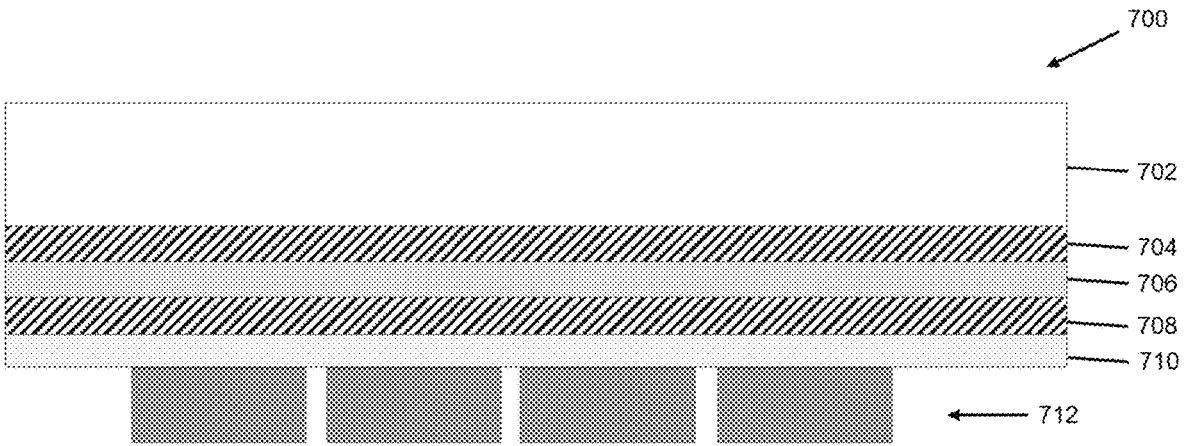
FIG. 7 illustrates a side view of an embodiment of a donor plate assembly comprising a light absorbing material.

FIG. 7 shows a side view of an assembly 700 which includes a donor plate 702, a first cladding layer 704 disposed over the donor plate 702, a light absorbing material 706 disposed over the first cladding layer 704, a second cladding layer 708 disposed over the light absorbing material 706, and release layer 710 disposed over the second cladding layer 708, and a plurality of components 712 disposed over the release layer 710. In some embodiments, the configuration of the cladding layers and/or the properties of light absorbing material enable the light absorbing material to act as a waveguide for light injected through the side edge of the donor plate. In some embodiments, the thickness of the light absorbing material is, is about, is at most, or is at most about, 500 nm, 600 nm, 700 nm, 800 nm, 900 nm, 1 μm, 1.2 μm, 1.5 μm, 2 μm, 3 μm, 4 μm, 5 μm, 6 μm, 7 μm, 8 μm, 9 μm, 10 μm or 12 μm, or any range of values therebetween. In some embodiments, the assembly does not include the first cladding layer. In some embodiments, the index of refraction of the light absorbing material is greater than the donor plate material (e.g., silica). In some embodiments, the second cladding layer has a large evanescent wave penetration value. In some embodiments where a cladding layer(s) is utilized, the light of radiative heating is bound or substantially bound between the cladding layers or the donor plate and the cladding layer through reflection (e.g., total internal reflection). In some embodiments where a cladding layer(s) is utilized, the light of radiative heating does not or does not substantially contact the release layer. In some embodiments where a cladding layer(s) is utilized, the wavelengths of radiative heating may overlap or substantially overlap with the actinic irradiation wavelengths.

Figure 8:
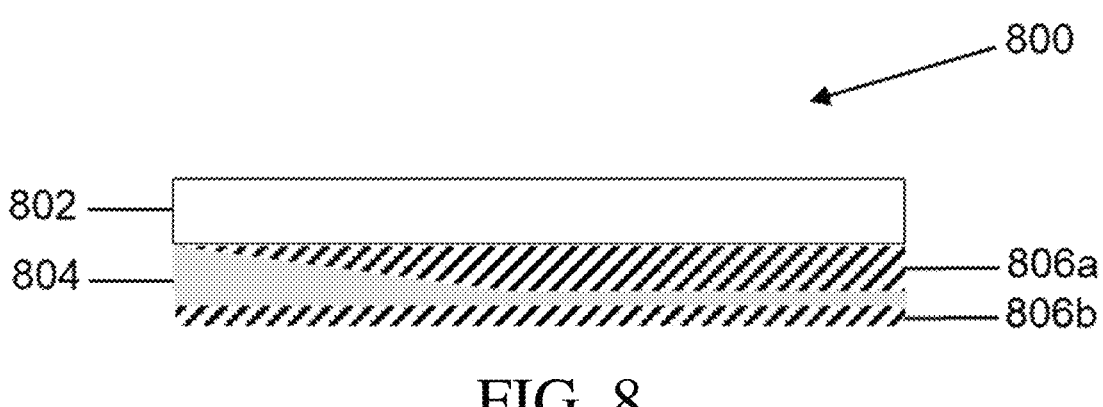
FIG. 8 illustrates a side view of an embodiment of a donor plate assembly comprising a graded light absorbing material.

FIG. 8 shows a side view of an assembly 800 which includes a donor plate 802, a first cladding layer 806a disposed over the donor plate 802, a graded light absorbing material 804 disposed over the first cladding layer 806a, and a second cladding layer 806b disposed over the graded light absorbing material 804. The graded light absorbing material 804 is shown decreasing in thickness from the proximal to the distal end of the donor plate 802, while the first cladding layer is shown increasing in thickness from the proximal to the distal end of the donor plate 802. In some embodiments, a graded light absorbing layer may aid in flattening the profile of the light injected from the side edges of the donor plate. In some embodiments, the graded light absorbing material may decrease in thickness from the proximal end to the middle portion of the donor plate, and then increase in thickness from the middle portion to the distal end of the donor plate. In some embodiments, the largest thickness of the graded light absorbing layer is, is about, or is at least, 5 μm, 6 μm, 7 μm, 8 μm, 9 μm, 10 μm, 12 μm, 15 μm, 20 μm or 25 μm, or any range of values therebetween. In some embodiments, the smallest thickness of the graded light absorbing layer is, is most, or is at most, 500 nm, 600 nm, 700 nm, 800 nm, 900 nm, 1 μm, 1.2 μm, 1.5 μm, 2 μm, 3 μm, 4 μm, 5 μm, 6 μm, 7 μm, 8 μm, 9 μm or 10 μm, or any range of values therebetween.

In some embodiments, the light absorbing material is an inorganic light absorbing material or an organic light absorbing material. In some embodiments, the inorganic light absorbing material includes $Nd_2O_3$, $Sm_2O_3$, $V_2O_3$, CoO, NiO, and $MnO_2$. In some embodiments, host materials include $SiO_2$, $Al_2O_3$, and other generally transparent dielectrics. In some embodiments, the organic light absorbing material is a polycarbonate compound and/or an aromatic compound. In some embodiments, aromatic compounds include quinoxaline compounds (e.g., 4,6,7,9-tetra(thiophen-2-yl)-[1,2,5]thiadiazolo[3,4-g]quinoxaline, and 2,2'-(6,6,12,12-tetraoctyl-6,12-dihydroindeno[1,2-b]fluorene-2,8-diyl)bis(4,4,5,5-tetramethyl-1,3,2-dioxaborolane)). For example, in some embodiments a few micron thick polycarbonate film shows ~10% absorbance at 3000 cm$^{-1}$ (3.3 μm, CH aromatic ring), 45% at 1800 cm$^{-1}$ (5.5 μm) and 85% at 1100-1300 (9.1-7.7 μm; the strongest are 0-C—O bands). In some embodiments, a quantum cascade laser (QCL)

could supply these wavelengths. As fused silica absorbs strongly >4.6 μm, in some embodiments BaF may be utilized for the substrate as it is suitably transparent both in that IR region and the UV. In some embodiments, the aromatic compound (e.g., 4,6,7,9-tetra(thiophen-2-yl)-[1,2,5]thiadiazolo[3,4-g]quinoxaline) have strong absorbances in the near IR (e.g., peak at 900 nm). In some embodiments, the aromatic compound absorbs in the UV, and therefore a photoactive sensitizer (e.g., PAG) may be selected that absorb in the valleys in between the UV peaks of the aromatic compound.

In these embodiments, IR laser diodes and/or LEDs may advantageously be used as radiative heating sources for the heating process. In some embodiments, wavelengths in the region from about 700 to about 900 nm may be utilized. In some embodiments, solid-state emitters are commercially available with the capability to supply the required energy in pulses of not more than several microseconds duration. In some embodiments, methods and equipment for coupling their emission into fibers which can launch the light into the donor plate waveguide are utilized. In some embodiments, other wavelengths and emitter technologies may also be used, depending on the choice of absorber.

In some embodiments, a laser whose output is sufficiently coherent to remain collimated over a propagation distance of tens of centimeters may be used as the light source for radiative heating. In some embodiments, a waveguide structure may not be necessary to confine the light to a thin layer. In some embodiments, the laser output is shaped by suitable lenses into a thin slab (e.g., of the order of a few micrometers thick and/or as wide as the donor plate), and is directed into the bottom edge of the substrate (e.g., donor plate). In some embodiments, the laser light is directed adjacent to the release layer and/or into the release layer itself.

In some embodiments, the materials that are heated by radiative heating may have sufficient radiative heating absorbance (e.g., IR absorbance) to be heated (e.g., to at least the decomposition temperature, or near the decomposition temperature). In some embodiments, lasers that may be suitable include $CO_2$, YAG (e.g., 355 nm), Nd:YAG (and related lasers such as Nd:YLF) (e.g., about 1 μm and about 1.3 μm), diode lasers (e.g., —800-900 nm), erbium-doped fiber (e.g., about 1.5 μm), quantum cascade lasers (QCLs) (e.g., multiple emission wavelengths above about 3 μm), $CO_2$ lasers (e.g., about 10.6 μm). alexandrite laser (e.g., about visible red to near IR), Ti-sapphire laser (e.g., about visible red to near IR), excimer laser (e.g., XeF excimer; 351 nm), and others with near-IR fundamental outputs. In some embodiments, an optical parametric amplifier is utilized to produce the required wavelength of light (e.g., mid-IR light). In some embodiments, a plurality of radiative heating sources (e.g., LEDs and/or lasers (e.g., of the same or different type and/or intensity)) may be used. In some embodiments, diode lasers may have the benefit of being fabricated by semiconductor processing (e.g., potentially with lower cost than lasers involving crystals or gas discharges). In some embodiments, diode lasers may have variable pulse lengths in the sub-μs regime, and therefore may in some embodiments span the values of τ. In some embodiments, diode lasers may be combined into arrays (e.g., similar to "diode bars" which are used to pump YAG lasers) to supply the necessary intensity. In some embodiments, the diode laser may be operated in continuous wave (i.e., cw) or pulsed mode. In some embodiments, $CO_2$ lasers may be utilized at high power, for example with cw outputs up to 8 kW or 20 kW. In some embodiments, $CO_2$ lasers emit at about 5.5 μm and/or 10.6 μm, with some nearby emission lines. In some embodiments, high-power $CO_2$ lasers have powers of about 1-3 kW. In some embodiments, $CO_2$ lasers may have pulse widths of about 10 μs or more. In some embodiments, $CO_2$ lasers may have duty cycles of order 50%.

In some embodiments, other wavelengths which match low-level absorbances of the materials may also be useful.

Combination Heating

In some embodiments, heating of the release layer may comprise a combination of conductive and radiative heating. In some embodiments, conductive heating may be performed concurrently with, prior to and/or subsequent to radiative heating. In some embodiments, conductive heating may be performed for the same amount of time, a similar amount of time, or for different amounts of time relative to radiative heating. For example, in some embodiments a transparent conducting oxide layer may be used to heat the release layer to near the decomposition temperature (e.g., at a heating rate which is slow compared to the transfer reaction time), and a short pulse of radiative heating (e.g., IR light) is injected into the waveguide structure to heat the release layer to the decomposition temperature. In some embodiments, the short pulse of radiative heating causes the transfer of the components to occur.

Modes of Heating

Heating processes (e.g., conductive heating, optical heating) of the release layer may be performed in various modes. The modes described herein include 1) Static Mode, 2) Real-Time Mode, and 3) Mixed Modes.

1) Static Mode

In some embodiments, the release layer is heated in a static mode by heating slowly (e.g., over a time period of, of about, of at least, or of at least about, 10 μs, 20 μs, 50 μs, 100 μs, 200 μs, 300 μs, 500 μs, 750 μs, 1 ms, 5 ms, 8 ms, 10 ms, 20 ms, 50 ms, 100 ms, 200 ms, 300 ms, 500 ms, 750 ms or 1 s, or any range of values therebetween) to the decomposition temperature $T_{sd}$ (e.g., the sensitizer decomposition temperature (e.g., photoacid generator ("PAG") catalyst)). In some embodiments, the heating is performed prior to actinic irradiation optical exposure, and then the actinic irradiation (e.g., to produce the acid) is delivered in a pulse (e.g., quickly; 10 ns-10 μs). In some embodiments, the heating is performed subsequent to actinic irradiation. In some embodiments, the heating is performed concurrently with actinic irradiation. In some embodiments, static mode heating is performed over a period of time of, of about, of at least, or of at least about, 10 μs, 20 μs, 50 μs, 100 μs, 200 μs, 300 μs, 500 μs, 750 μs, 1 ms, 5 ms, 8 ms, 10 ms, 20 ms, 50 ms, 100 ms, 200 ms, 300 ms, 500 ms, 750 ms or 1 s, or any range of values therebetween.

In some embodiments, an advantage of this approach is that heating the thin film is relatively simple (e.g., electrically simple), wherein the required power is delivered to achieve the desired decomposition temperature while compensating for diffusion losses (e.g., to the $SiO_2$ of the substrate). As an example, in some embodiments the requirement for a 20 cm×20 cm donor plate is of the order of magnitude of 1 kW. A further advantage of this mode is that the slow rise in temperature of the heated system (e.g., donor plate, transparent resistive layer, release polymer, and transferrable components, plus any other layers that might be present) minimizes thermal stress which may cause cracking or delamination. The rate of heating may vary over wide ranges. In some embodiments, the system can be brought to a specific temperature (e.g., as needed for the sensitized decomposition) and held there as long as necessary, or in some embodiments the system can be heated over a period of seconds or milliseconds and then allowed to cool before the next transfer operation step (e.g., further heating and/or actinic irradiation).

In some embodiments, static mode heating may be performed by conductive heating (e.g., electrical heating) and/or radiative heating. In some embodiments, static heating may be performed by a light source (e.g., a laser) to deliver a fast initiating pulse of light. For example, in some embodiments for a 3 mJ/cm$^2$ nominal dose in 10 µs, a power of 300 W/cm$^2$ may be required. In some embodiments, the required power may be supplied by a conventional laser and/or an LED. In some embodiments, the absorption maximum of the sensitizer (e.g., PAG catalyst) is about 300 nm. As such, in some embodiments far-UV emitting light sources (e.g., LEDs) may be used to emit up to 1 W to each component (e.g., ~100×100 µm chip). In some embodiments, a heating duty cycle of, of about, of at most, or of at most about, 1%, 0.5%, 0.1%, 0.05%, 0.01%, 0.008%, 0.005%, 0.004%, 0.003%, 0.002%, 0.001%, 0.0009%, 0.0008%, 0.0005%, 0.0001%, 0.00005% or 0.00001% is utilized, or any range of values therebetween. For example, in some embodiments power output may be utilized with low duty cycles (e.g. 1% or lower) in order to effectively remove heat. In other embodiments, the duty cycle is of the order of 10$^{-3}$% or less. In some embodiments, the radiative heating source (e.g., laser) is pulsed on for 10 µs and then off for 1-10 s. In some embodiments, the device is not intermittently cooled. In some embodiments, an all-diode-based illuminator is utilized. In other embodiments, a YAG or other large DUV laser is utilized.

2) Real-Time Mode

In some embodiments, the release layer is heated in a real-time mode by pulse heating quickly (e.g., in less than 10 µs) to $T_{sd}$. In some embodiments, the heating is performed prior to actinic irradiation optical exposure, and then the actinic irradiation (e.g., to produce the acid) is delivered in a pulse (e.g., quickly; 10 ns-10 µs). In some embodiments, the heating is performed subsequent to actinic irradiation. In some embodiments, the heating is performed concurrently with actinic irradiation. In some embodiments, real-time mode heating is performed over a period of time of, of about, of at most, or of at most about, 5 ns, 10 ns, 20 ns, 30 ns, 40 ns, 50 ns, 60 ns, 70 ns, 80 ns, 90 ns, 100 ns, 200 ns, 300 ns, 400 ns, 500 ns, 600 ns, 700 ns, 800 ns, 1 µs, 2 µs, 3 µs, 4 µs, 5 µs, 6 µs, 7 µs, 8 µs, 9 µs, 10 µs, 20 µs, 50 µs, 100 µs or 200 µs, or any range of values therebetween.

For example, in some embodiments heating (e.g., radiative heating) is carried out while the film is at ambient temperature (e.g. 20C), and then it is subsequently heated (e.g. in less than 10 µs) to $T_{sd}$. In some embodiments, a power of nominally 15 mJ/cm$^2$ in 10 µs, or 1.5 kW/cm$^2$, is utilized. For a 20×20 cm donor plate this is 600 kW total.

In some embodiments, power supplies for generating short pulses of such high current and/or voltage comprise may be utilized. In some embodiments, to balance the requirement between current and voltage, voltages in the kV range and currents in the hundreds of amps (A) may be utilized. Recognizing that the numerical goal itself is only an approximation, Table 1 provides example voltages, currents and resistances that may be used to achieve the same power. Table 1 assume a single sheet of transparent conducting oxide ("TCO") (20×20 cm), with the voltage applied along one edge. The stated R is in ohms, but it is also Ω/□ for this geometry. R is of the order of 30Ω/□ for 100 nm thickness (e.g. this is the value for La-doped SrSnO$_3$). In some embodiments, thickness may not be easily increased (due to optical absorbance), but may be decreased (=higher R).

Thus, in some embodiments, higher voltages and lower currents may be favored. There are several ways to produce such electrical pulses, for example included power MOSFETs, insulated gate bipolar transistors (IGBTs), power bipolar transistors, and "solidtrons" (trade name of Excelitas Technologies for what they call a thyristor but which is a solid state component). There are also high power switching devices using vacuum tubes, however semiconductors are smaller, longer lived, and less expensive.

TABLE 1

| Power | Voltage | Current | Resistance |
|---|---|---|---|
| 600000 | 1000 | 600 | 1.67 |
| 600000 | 100 | 6000 | 0.017 |
| 600000 | 10000 | 60 | 168.7 |
| 600000 | 25000 | 24 | 1042 |
| 600000 | 3000 | 200 | 10 |
| 600000 | 4000 | 150 | 27 |

In some embodiments, the heating source (e.g., TCO) may be divided into strips to lower the current requirement for each supply. If a very narrow gap (e.g. 0.5 µm) is lithographically fabricated between two strips of heating sources (e.g., TCO), all areas of polymer surface will still be within 0.25 µm of the heating element. Such an architecture would not substantially depart from a uniform heating architecture. In some embodiments, even narrower gaps may be utilized, since there should be minimal electrical potential difference between the strips. Fluctuations in the temporal characteristics of the driving electronics might produce very small transient differences, but they would not be enough to cause shorting between the two strips. For example, if a 20 cm square sheet is divided into ten strips, the power required for each is 1/10 of what is given in Table 1, and the product of voltage and current correspondingly reduced. Thus 60,000 W could be achieved with 4000 V, 15 A, and 267Ω (which would be achievable with 27Ω/□ TCO sheet resistance). While 30Ω/□ is a "safe" number for the achievable TCO properties, in some embodiments lower values could be used depending on the UV power available for the photochemistry, and the required throughput of that step.

In some embodiments, processes disclosed may require a rapid change of both voltage and current, and therefore capacitance and inductance must be acceptable. For capacitance, the basic charging equation is relevant: $V=Vo[1-e-(t/RC)$. The capacitance of a parallel plate geometry is $C=\varepsilon A/d$, where $\varepsilon=\varepsilon_0\varepsilon_r$ is the permittivity, ~4×8.85×10$^{-12}$º F./m. In some embodiments, if the return path of current is on the opposite side of the donor plate from the TCO, d=thickness of the plate ~1 mm, and C~1.5 nF. The time constant for charging the sheet to 1 kV is then $t=-RC\{ln[1-(V/V_0)]\}\approx4.6RC$ (to charge to 99% of the desired voltage) 5 ns. In some embodiments, the return path is a wire rather than a conducting plane, and a simple calculation is not possible. Estimates based on bioelectronics (e.g. the capacitance of a person carrying a conductive sheet) are at least an order of magnitude lower, which leads to a correspondingly faster rise time.

The calculation of parasitic inductance leads to a similarly small (e.g., ns or less) time constant. These numbers and the formulas are approximate, but they show that these effects will not prevent the system from reaching the desired electrical state in the required time.

In some embodiments, the power components (e.g., solid-state) referenced above may be small enough to be incorporated into a modest-sized unit. In some embodiments, the power component may be part of a photo-exposure tool. In some embodiments, contact may be made, as noted before, against a copper or gold layer covering the conductive heating source (e.g., TCO) on the edge of the substrate (e.g., donor plate), or on a narrow strip on a top and/or bottom major surface. Thus, in some embodiments, there may not be a need to remove the substrate (e.g., donor plate) from the photo-exposure tool to carry out the thermal transfer process.

In some embodiments, in the real-time mode the amount of heat introduced into the substrate (e.g., donor plate) may be limited not only by the thinness of the heated film, but also the short time during which the heat is on (e.g., about $10^{-5}$ duty cycle). In some embodiments, the conductive heating source (e.g., TCO) layer is protected by a thin layer (e.g. 100-500 nm) of hard insulator. In some embodiments, a hard insulator includes materials such as silicon oxide, silicon nitride, aluminum oxide, boron nitride, diamond, etc.

3) Mixed Mode

In some embodiments, the release layer is heated by a combination static mode and real-time mode heating. In some embodiments, the real-time mode heating is performed prior to, subsequent to or concurrently with the static mode heating. For example, in some embodiments slow static mode preheating of the release layer to a temperature near but below Td is achieved, and then a subsequent real-time pulse of heat (e.g., conductive heating (e.g., electrical energy) and/or radiating heating) (e.g. smaller than what is calculated in Table 1) is applied to achieve at least Ed. In some embodiments, the subsequent heating step initiates the degradation reaction of the release layer.

In some embodiments, mixed mode heating processes may be advantageous in that the process may aid in controlling the timing of the vapor expansion, as well as have system mechanics advantages (e.g., such as reducing the I and V requirements of the pulsed power supplies). In some embodiments, any set of parameters involving heating up to but not above Ed over a time that is acceptable for throughput may be used. In some embodiments, the temperature can also be varied (by varying the heat input) during the reaction.

While certain embodiments have been described, these embodiments have been presented by way of example only, and are not intended to limit the scope of the disclosure. Indeed, the novel methods and systems described herein may be embodied in a variety of other forms. Furthermore, various omissions, substitutions and changes in the systems and methods described herein may be made without departing from the spirit of the disclosure. The accompanying claims and their equivalents are intended to cover such forms or modifications as would fall within the scope and spirit of the disclosure.

Features, materials, characteristics, or groups described in conjunction with a particular aspect, embodiment, or example are to be understood to be applicable to any other aspect, embodiment or example described in this section or elsewhere in this specification unless incompatible therewith. All of the features disclosed in this specification (including any accompanying claims, abstract and drawings), and/or all of the steps of any method or process so disclosed, may be combined in any combination, except combinations where at least some of such features and/or steps are mutually exclusive. The protection is not restricted to the details of any foregoing embodiments. The protection extends to any novel one, or any novel combination, of the features disclosed in this specification (including any accompanying claims, abstract and drawings), or to any novel one, or any novel combination, of the steps of any method or process so disclosed.

Furthermore, certain features that are described in this disclosure in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations, one or more features from a claimed combination can, in some cases, be excised from the combination, and the combination may be claimed as a subcombination or variation of a subcombination.

Moreover, while operations may be depicted in the drawings or described in the specification in a particular order, such operations need not be performed in the particular order shown or in sequential order, or that all operations be performed, to achieve desirable results. Other operations that are not depicted or described can be incorporated in the example methods and processes. For example, one or more additional operations can be performed before, after, simultaneously, or between any of the described operations. Further, the operations may be rearranged or reordered in other implementations. Those skilled in the art will appreciate that in some embodiments, the actual steps taken in the processes illustrated and/or disclosed may differ from those shown in the figures. Depending on the embodiment, certain of the steps described above may be removed, others may be added. Furthermore, the features and attributes of the specific embodiments disclosed above may be combined in different ways to form additional embodiments, all of which fall within the scope of the present disclosure. Also, the separation of various system components in the implementations described above should not be understood as requiring such separation in all implementations, and it should be understood that the described components and systems can generally be integrated together in a single product or packaged into multiple products. For example, any of the components for an energy storage system described herein can be provided separately, or integrated together (e.g., packaged together, or attached together) to form an energy storage system.

For purposes of this disclosure, certain aspects, advantages, and novel features are described herein. Not necessarily all such advantages may be achieved in accordance with any particular embodiment. Thus, for example, those skilled in the art will recognize that the disclosure may be embodied or carried out in a manner that achieves one advantage or a group of advantages as taught herein without necessarily achieving other advantages as may be taught or suggested herein.

Conditional language, such as "can," "could," "might," or "may," unless specifically stated otherwise, or otherwise understood within the context as used, is generally intended to convey that certain embodiments include, while other embodiments do not include, certain features, elements, and/or steps. Thus, such conditional language is not generally intended to imply that features, elements, and/or steps are in any way required for one or more embodiments or that one or more embodiments necessarily include logic for deciding, with or without user input or prompting, whether these features, elements, and/or steps are included or are to be performed in any particular embodiment.

Conjunctive language such as the phrase "at least one of X, Y, and Z," unless specifically stated otherwise, is otherwise understood with the context as used in general to convey that an item, term, etc. may be either X, Y, or Z. Thus, such conjunctive language is not generally intended to imply that certain embodiments require the presence of at least one of X, at least one of Y, and at least one of Z.

Language of degree used herein, such as the terms "approximately," "about," "generally," and "substantially" as used herein represent a value, amount, or characteristic close to the stated value, amount, or characteristic that still performs a desired function or achieves a desired result.

The scope of the present disclosure is not intended to be limited by the specific disclosures of embodiments in this section or elsewhere in this specification, and may be defined by claims as presented in this section or elsewhere in this specification or as presented in the future. The language of the claims is to be interpreted broadly based on the language employed in the claims and not limited to the examples described in the present specification or during the prosecution of the application, which examples are to be construed as non-exclusive.

While certain embodiments have been described, these embodiments have been presented by way of example only, and are not intended to limit the scope of the disclosure. Indeed, the novel methods and systems described herein may be embodied in a variety of other forms. Furthermore, various omissions, substitutions and changes in the systems and methods described herein may be made without departing from the spirit of the disclosure. The accompanying claims and their equivalents are intended to cover such forms or modifications as would fall within the scope and spirit of the disclosure. Accordingly, the scope of the present inventions is defined only by reference to the appended claims.

What is claimed is:

1. A process for transferring a component, comprising:
   providing an assembly comprising a substrate, a release layer and a component, wherein the release layer is disposed over the substrate and the component is adhered to the release layer;
   heating the release layer from a heating source to at least a decomposition temperature, wherein the heating is selected from the group consisting of a conductive heating, a radiative heating, and combinations thereof; and
   exposing the release layer to an actinic wavelength of light from an actinic irradiation source;
   wherein the release layer comprises a photo enhanced decomposition compound selected from at least one of a polymer and an oligomer, and wherein the photo enhanced decomposition compound is configured to decompose when heated and exposed to the actinic wavelength of light;
   wherein the heating and exposing steps degrade the release layer and transfer the component from the substrate to a target substrate;
   wherein the heating source and the actinic irradiation source are different sources; and
   wherein at least one of the heating and exposing steps are performed within a pulse period.

2. The process of claim 1, wherein the heating comprises radiative heating with a radiative wavelength of light, wherein the overlap between the radiative wavelength and actinic wavelength is at most 20%.

3. The process of claim 2, wherein the radiative heating is at a radiative wavelength selected from the group consisting of a UV wavelength, a visible wavelength, an IR wavelength, a microwave wavelength, and combinations thereof.

4. The process of claim 2, wherein the radiative heating is at a radiative wavelength of about 300 nm to about 100000 nm.

5. The process of claim 2, wherein the substrate comprises a donor plate and a light absorbing material.

6. The process of claim 5, wherein the light absorbing material is selected from the group consisting of $Nd_2O_3$, $Sm_2O_3$, $V_2O_3$, CoO, NiO, $MnO_2$, a polycarbonate compound, an aromatic compound, and combinations thereof.

7. The process of claim 2, wherein the radiative heating is applied from a side edge of the assembly.

8. The process of claim 1, wherein the decomposition temperature is about 100° C. to about 350° C.

9. The process of claim 1, further comprising heating the release layer to a first temperature prior to heating the release layer to the decomposition temperature.

10. The process of claim 9, wherein the first temperature is about 100° C. to about 350° C.

11. The process of claim 1, wherein the pulse period is about 10 ns to about 10 μs.

12. The process of claim 1, wherein the heating step is performed prior to the exposing step.

13. The process of claim 1, wherein the heating step is performed subsequent to the exposing step.

14. The process of claim 1, wherein the heating step is performed concurrently with the exposing step.

15. The process of claim 1, wherein the actinic wavelength of light is selected from the group consisting of a UV wavelength, a visible wavelength, and combinations thereof.

16. The process of claim 1, wherein the actinic wavelength of light is about 200 nm to about 400 nm.

17. The process of claim 1, wherein the actinic irradiation source comprises a power density of about 10 mJ/cm$^2$ to about 200 mJ/cm$^2$.

18. The process of claim 1, wherein the heating is applied directly to the release layer.

19. The process of claim 1, wherein the heating is applied directly to the component, and the components heats the release layer to the decomposition temperature.

20. The process of claim 1, wherein the heating is applied directly to the substrate, and the substrate heats the release layer to the decomposition temperature.

21. The process of claim 1, wherein the assembly further comprises a conductive heating source.

22. The process of claim 21, wherein the conductive heating source comprises a transparent conductive heating source.

23. The process of claim 22, wherein the transparent conductive heating source is selected from the group consisting of ITO, β-$Ga_2O_3$, gold, silver, La-doped $SrSnO_3$, and combinations thereof.

24. The process of claim 1, wherein a thermal decomposition temperature of the photo enhanced decomposition compound decreases to at most the decomposition temperature when exposed to the actinic wavelength of light.

25. The process of claim 1, wherein the photo enhanced decomposition compound comprises a linkage and a core unit comprising a tetralin core, a cyclohexene core, copolymers thereof, and combinations thereof.

26. The process of claim 1, wherein the release layer further comprises a photoactive sensitizer.

27. A process for transferring a component, comprising:
   providing an assembly comprising a substrate, a release layer and a component, wherein the release layer is disposed over the substrate and the component is adhered to the release layer;

heating the release layer from a heating source to at least a decomposition temperature, wherein the heating is selected from the group consisting of a conductive heating, a radiative heating and combinations thereof, and wherein the decomposition temperature is about 180° C. to about 220° C.; and exposing the release layer to an actinic wavelength of light from an actinic irradiation source, wherein the actinic wavelength of light is a wavelength of about 230 nm to about 360 nm;

wherein the release layer comprises a photo enhanced decomposition compound selected from at least one of a polymer and an oligomer, wherein the photo enhanced decomposition compound comprises a linkage and a core unit comprising a tetralin core, a cyclohexene core, copolymers thereof, and combinations thereof, and wherein the photo enhanced decomposition compound is configured to decompose when heated and exposed to the actinic wavelength of light;

wherein the heating and exposing steps degrade the release layer and transfer the component from the substrate to a target substrate;

wherein the heating source and the actinic irradiation source are different sources; and wherein at least one of the heating and exposing steps are performed within a pulse period of about 10 ns to about 10 μs.

28. An assembly for transferring a component, comprising:

a substrate;

a plurality of heating sources disposed over the substrate; and a release layer disposed over the plurality of heating sources.

29. The assembly of claim 28, further comprising a nanoporous material disposed between the substrate and the plurality of heating sources.

30. An assembly for transferring a component, comprising:

a substrate;

a light absorbing layer disposed over the substrate;

a first cladding layer disposed over the light absorbing layer; and a release layer disposed over the first cladding layer.

31. The assembly of claim 30, further comprising a second cladding layer disposed between the substrate and the light absorbing layer.

32. The assembly of claim 30, wherein the light absorbing layer is a graded light absorbing layer.

* * * * *